US008618462B2

(12) United States Patent
Kimura et al.

(10) Patent No.: US 8,618,462 B2
(45) Date of Patent: Dec. 31, 2013

(54) PHOTOELECTRIC TRANSDUCER DEVICE HAVING A RECTIFIER IS A SECOND TRANSISTOR WITH DIODE-CONNECTED AND NORMALLY ON

(75) Inventors: Hajime Kimura, Kanagawa (JP); Satoshi Shinohara, Kanagawa (JP); Yoshiaki Ito, Tokyo (JP); Takuro Ohmaru, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 286 days.

(21) Appl. No.: 13/114,351

(22) Filed: May 24, 2011

(65) Prior Publication Data
US 2011/0309239 A1    Dec. 22, 2011

(30) Foreign Application Priority Data

May 26, 2010    (JP) .................................. 2010-120181

(51) Int. Cl.
*H01J 40/14*    (2006.01)
(52) U.S. Cl.
USPC .................................... 250/214 R; 250/203.4
(58) Field of Classification Search
USPC .......... 250/214 R, 203.4, 214.1, 214 LS, 205;
323/222–225, 268–271, 282–285;
363/21.14, 205–207, 67–71, 89, 127;
327/514
See application file for complete search history.

(56) References Cited

U.S. PATENT DOCUMENTS

| | | | |
|---|---|---|---|
| 4,472,641 A | 9/1984 | Dickey et al. | |
| 5,161,097 A | 11/1992 | Ikeda | |
| 5,661,644 A * | 8/1997 | Bergman et al. | ........... 363/56.01 |
| 5,909,108 A | 6/1999 | He et al. | |
| 6,021,499 A | 2/2000 | Aleshi | |
| 6,038,147 A | 3/2000 | Jacobs et al. | |
| 6,449,136 B2 | 9/2002 | Galecki et al. | |
| 6,580,251 B2 | 6/2003 | Takeuchi | |
| 6,757,590 B2 | 6/2004 | Ross et al. | |
| 7,118,970 B2 | 10/2006 | Das et al. | |
| 7,443,052 B2 | 10/2008 | Wendt et al. | |

(Continued)

FOREIGN PATENT DOCUMENTS

| | | |
|---|---|---|
| JP | 8-279518 | 10/1996 |
| JP | 9-69647 | 3/1997 |

(Continued)

OTHER PUBLICATIONS

Nuzillat, G. et al., "A Subnanosecond Integrated Switching Circuit wih Mesfet's for LSI" IEEE Journal of Solid-State Circuits, vol. SC-11, No. 3, Jun. 1, 1976, pp. 385-394.

(Continued)

*Primary Examiner* — Que T Le
(74) *Attorney, Agent, or Firm* — Husch Blackwell LLP

(57) ABSTRACT

An object is to obtain a diode having a small voltage drop and to reduce the fabrication cost of a converter circuit. A photoelectric transducer device including: a photoelectric transducer element; and a converter circuit stepping up or stepping down an output of the photoelectric transducer element and including a switching element and a rectifier, in which the switching element is a first insulated gate bipolar transistor that is normally off and in which the rectifier is a second insulated gate bipolar transistor that is diode-connected and normally on.

16 Claims, 19 Drawing Sheets

(56) References Cited

U.S. PATENT DOCUMENTS

| | | |
|---|---|---|
| 7,667,448 B2 | 2/2010 | Matsumoto et al. |
| 7,671,487 B2 | 3/2010 | Wang et al. |
| 7,705,362 B2 | 4/2010 | Das et al. |
| 2005/0068002 A1 | 3/2005 | Ozeki |
| 2006/0092588 A1 | 5/2006 | Realmuto et al. |
| 2007/0164612 A1 | 7/2007 | Wendt et al. |
| 2008/0007243 A1 | 1/2008 | Matsumoto et al. |
| 2009/0291520 A1 | 11/2009 | Yoshikawa |
| 2009/0293954 A1 | 12/2009 | Yamazaki |
| 2011/0273021 A1 | 11/2011 | Kimura et al. |
| 2012/0019222 A1 | 1/2012 | Kimura et al. |

FOREIGN PATENT DOCUMENTS

| | | |
|---|---|---|
| JP | 2002-108466 | 4/2002 |
| JP | 2002-141539 | 5/2002 |
| JP | 2004-22639 | 1/2004 |
| JP | 2005-312158 | 11/2005 |
| JP | 2008-11584 | 1/2008 |
| JP | 2008-15925 | 1/2008 |
| JP | 2008-503894 | 2/2008 |
| JP | 2008-300572 | 12/2008 |
| JP | 2009-10414 | 1/2009 |
| JP | 2009-200372 | 9/2009 |
| JP | 2009-283717 | 12/2009 |
| JP | 2010-10667 | 1/2010 |

OTHER PUBLICATIONS

Schneider, C.R. et al., "Analog CMOS Deterministic Boltzmann Circuits," IEEE Journal of Solid-State Circuits, vol. 28, No. 8, Aug. 1, 1993, pp. 907-914.

Cheng, W. et al., "Impact of Improved High-Performances Si(110)-Oriented Metal-Oxide-Semiconductor Field-Effect Transistors Using Accumulation-Mode Fully Depleted Silicon-on-Insulator Devices," Japanese Journal of Applied Physics, vol. 45, No. 4B, Apr. 25, 2006, pp. 3110-2116.

* cited by examiner

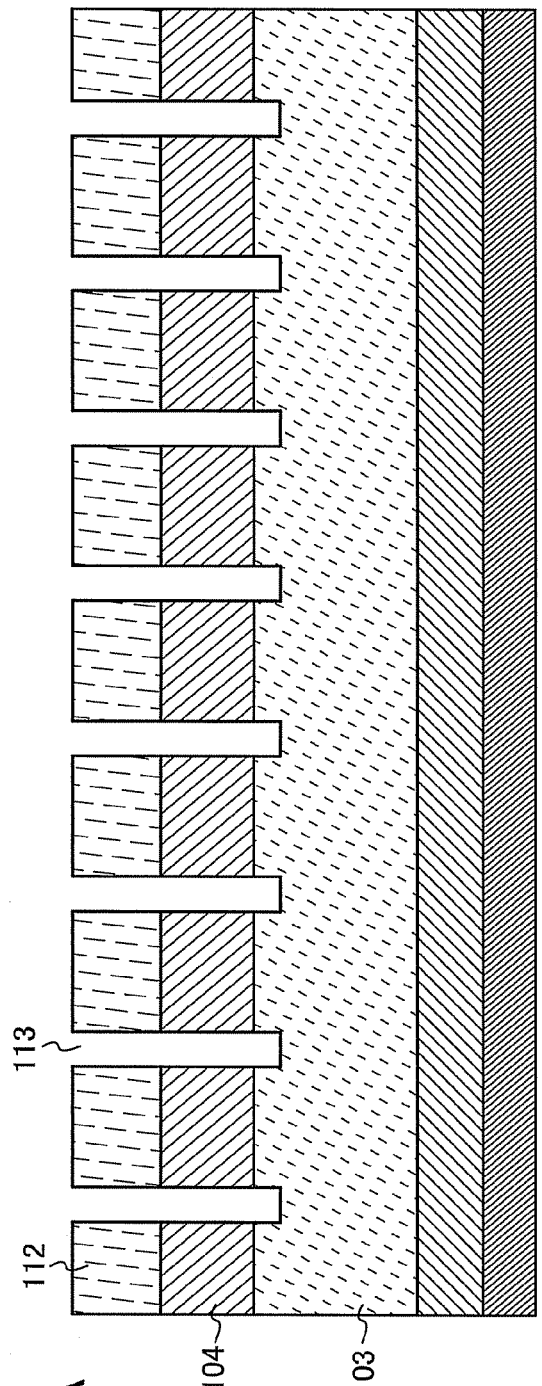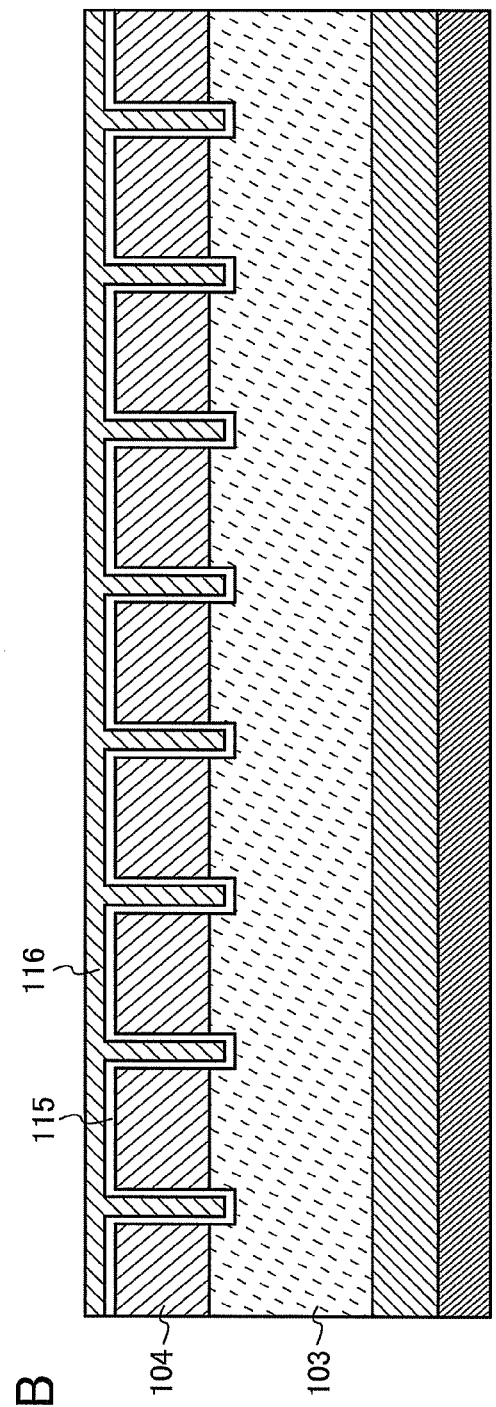

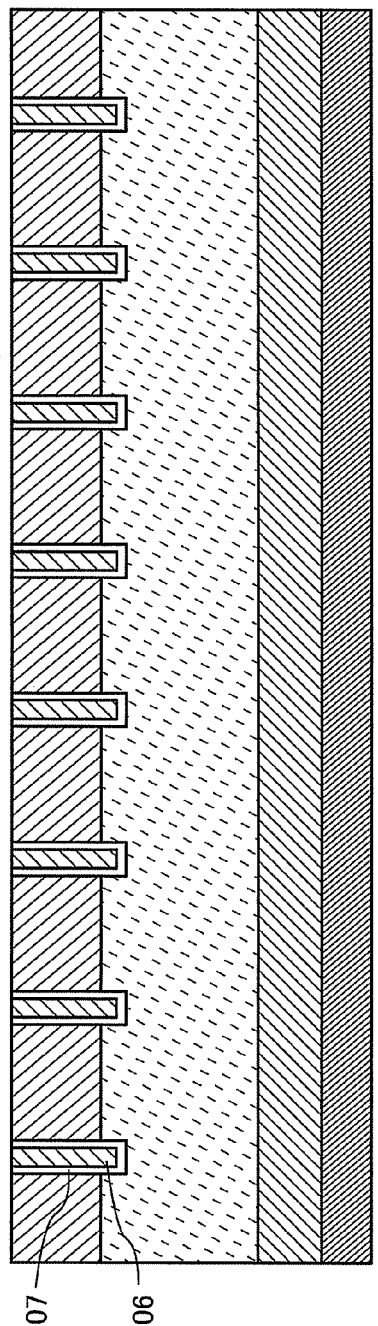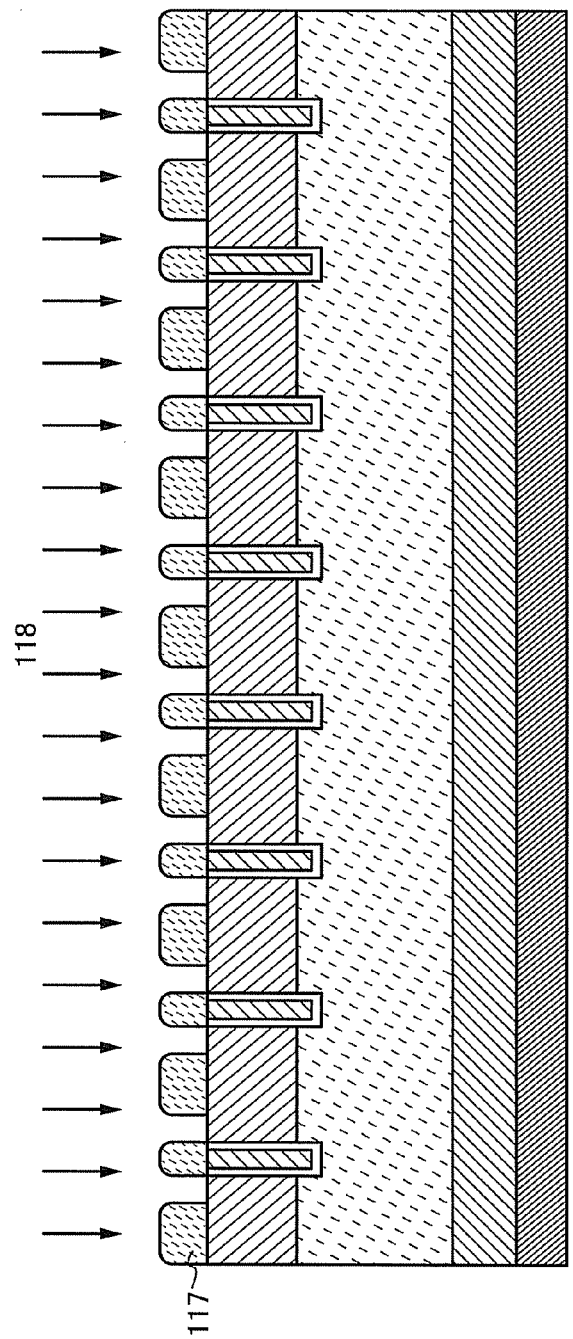
FIG. 7A
FIG. 7B

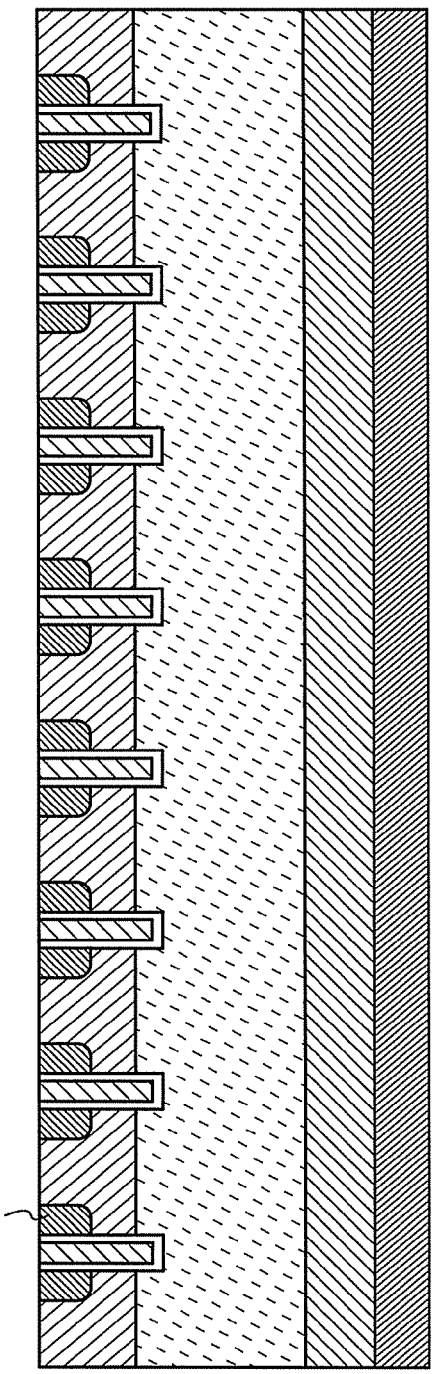
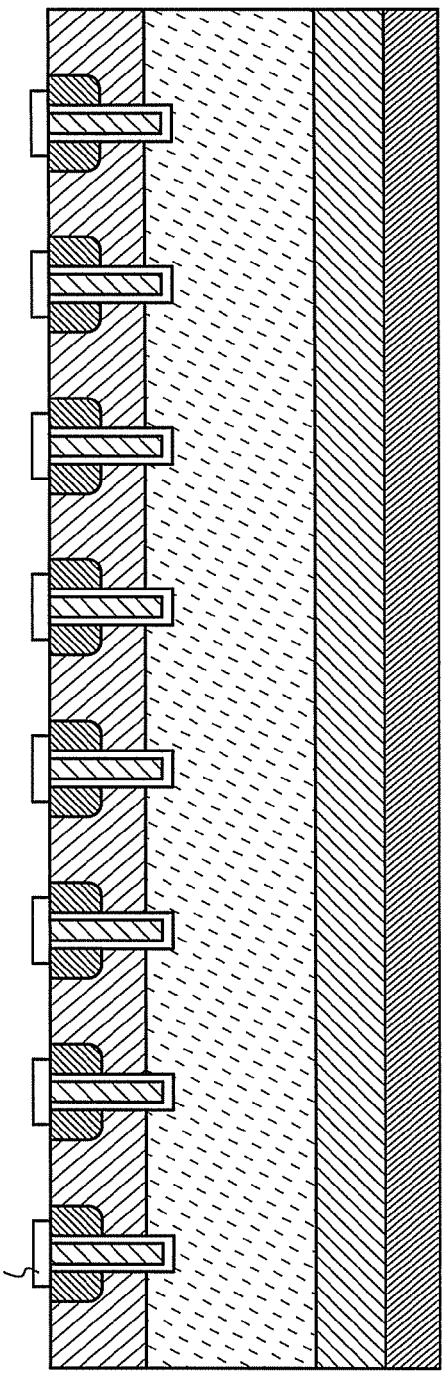
FIG. 8A
FIG. 8B

PHOTOELECTRIC TRANSDUCER DEVICE HAVING A RECTIFIER IS A SECOND TRANSISTOR WITH DIODE-CONNECTED AND NORMALLY ON

BACKGROUND OF THE INVENTION

1. Field of the Invention

One embodiment of the disclosed invention relates to a photoelectric transducer device and a fabrication method thereof.

2. Description of the Related Art

An example of a photoelectric transducer element which directly converts received light into power by a photovoltaic effect and outputs the power is a solar cell (see Patent Document 1). Unlike with a conventional power generation method, it is not necessary to convert light into thermal energy or kinetic energy in generating power with a solar cell.

Further, a photoelectric transducer device having a solar cell and a converter circuit, which converts direct-current (DC) power generated by the solar cell, formed on a surface of the solar cell where light is not received has attracted attention as a small or middle-sized photo voltaic system or an emergency power source (see Patent Document 2 or Patent Document 3).

Examples of such a converter circuit include a DC-DC converter (direct current-direct current converter) and a DC-AC converter (direct current-alternating current converter) (see Patent Document 4 or Patent Document 5).

The converter circuit shown in Patent Document 4 or Patent Document 5 includes a switching element and a rectifier. A transistor is used as the switching element, and a diode is used as the rectifier. A PN diode, for example, is used as such a diode (see Patent Document 6).

REFERENCE

[Patent Document 1] Japanese Published Patent Application No. 2010-10667
[Patent Document 2] Japanese Published Patent Application No. H9-69647
[Patent Document 3] Japanese Published Patent Application No. 2002-141539
[Patent Document 4] Japanese Published Patent Application No. 2005-312158
[Patent Document 5] Japanese Published Patent Application No. 2009-200372
[Patent Document 6] Japanese Published Patent Application No. 2004-22639

SUMMARY OF THE INVENTION

As shown in Patent Document 6, a PN diode has a large voltage drop.

In view of the above problem, an object of one embodiment of the disclosed invention is to provide a diode having a small voltage drop.

The converter circuit shown in Patent Document 4 or Patent Document 5 includes, for example, a diode and a transistor. Such a diode and a transistor are fabricated in different processes, making the fabrication cost of the converter circuit high.

In view of the above problem, an object of one embodiment of the disclosed invention is to reduce the fabrication cost of the converter circuit.

In one embodiment of the disclosed invention, a diode-connected normally-on transistor is used as a rectifier included in a converter circuit.

A normally-on transistor can be obtained by controlling the concentration of an impurity element giving one conductivity type, which is contained in a channel formation region.

Normally-on transistor is turned on when a voltage is applied to the gate electrode of the transistor. Therefore, a diode that is a diode-connected normally-on transistor has a smaller voltage drop than a PN diode.

A diode-connected normally-on transistor has a smaller voltage drop than a PN diode, and thus needs a lower voltage than a PN diode to compensate a voltage drop. A diode-connected normally-on transistor needs a lower voltage than a PN diode to compensate a voltage drop, and thus achieves lower power consumption of a converter circuit than a PN diode. A reduction in the power consumption of a converter circuit leads to a reduction in the power consumption of a photoelectric transducer device.

Thus, the use of a diode-connected normally-on transistor as a diode is preferable in that it reduces a voltage drop, needs a low voltage to compensate a voltage drop, reduces the power consumption of a converter circuit, and reduces the power consumption of a photoelectric transducer device.

Further, in one embodiment of the disclosed invention, a transistor is used as a switching element included in a converter circuit and a diode is used as a rectifier. A transistor that is the same as the above transistor except that it is diode-connected is used as the above diode. In other words, a rectifier and a switching element included in a converter circuit can be fabricated using the same material and in the same process.

Since a rectifier and a switching element can be fabricated using the same material and in the same process, fabrication cost can be reduced.

One embodiment of the disclosed invention is a photoelectric transducer device comprising: a photoelectric transducer element; and a converter circuit stepping up or stepping down an output of the photoelectric transducer element and including a switching element and a rectifier. The switching element is a first insulated gate bipolar transistor that is normally off. The rectifier is a second insulated gate bipolar transistor that is diode-connected and normally on.

One embodiment of the disclosed invention is a photoelectric transducer device comprising: a photoelectric transducer element; and a converter circuit stepping up or stepping down an output of the photoelectric transducer element and including a switching element and a rectifier. The switching element is a first insulated gate bipolar transistor that is normally off. The rectifier is a second insulated gate bipolar transistor that is diode-connected and normally on. The first insulated gate bipolar transistor includes a first emitter region, a first channel formation region, and a first collector region. The second insulated gate bipolar transistor includes a second emitter region, a second channel formation region having impurity concentration that is different from impurity concentration in the first channel formation region, and a second collector region.

One embodiment of the disclosed invention is a photoelectric transducer device comprising: a solar cell; and a converter circuit stepping up or stepping down an output of the solar cell and including a switching element and a rectifier. The switching element is a first insulated gate bipolar transistor that is normally off. The rectifier is a second insulated gate bipolar transistor that is diode-connected and normally on.

One embodiment of the disclosed invention is a photoelectric transducer device comprising: a solar cell; and a converter circuit stepping up or stepping down an output of the solar cell and including a switching element and a rectifier. The switching element is a first insulated gate bipolar transistor that is normally off. The rectifier is a second insulated gate bipolar transistor that is diode-connected and normally on. The first insulated gate bipolar transistor includes a first emitter region, a first channel formation region, and a first collector region. The second insulated gate bipolar transistor includes a second emitter region, a second channel formation region having impurity concentration that is different from impurity concentration in the first channel formation region, and a second collector region.

One embodiment of the disclosed invention is a photoelectric transducer device comprising: a photoelectric transducer element; and a converter circuit stepping up or stepping down an output of the photoelectric transducer element and including a switching element and a rectifier. The switching element is a first field-effect transistor that is normally off. The rectifier is a second field-effect transistor that is diode-connected and normally on.

One embodiment of the disclosed invention is a photoelectric transducer device comprising: a photoelectric transducer element; and a converter circuit stepping up or stepping down an output of the photoelectric transducer element and including a switching element and a rectifier. The switching element is a first field-effect transistor that is normally off. The rectifier is a second field-effect transistor that is diode-connected and normally on. The first field-effect transistor includes a first source region, a first drain region, and a first channel formation region. The second field-effect transistor includes a second source region, a second drain region, and a second channel formation region having impurity concentration that is different from impurity concentration in the first channel formation region.

One embodiment of the disclosed invention is a photoelectric transducer device comprising: a solar cell; and a converter circuit stepping up or stepping down an output of the solar cell and including a switching element and a rectifier. The switching element is a first field-effect transistor that is normally off. The rectifier is a second field-effect transistor that is diode-connected and normally on.

One embodiment of the disclosed invention is a photoelectric transducer device comprising: a photoelectric transducer element; and a converter circuit stepping up or stepping down an output of the photoelectric transducer element and including a switching element and a rectifier. The switching element is a first field-effect transistor that is normally off. The rectifier is a second field-effect transistor that is diode-connected and normally on. The first field-effect transistor includes a first source region, a first drain region, and a first channel formation region. The second field-effect transistor includes a second source region, a second drain region, and a second channel formation region having impurity concentration that is different from impurity concentration in the first channel formation region.

In one embodiment of the disclosed invention, the converter circuit is a DC-DC converter.

In one embodiment of the disclosed invention, the converter circuit is a DC-DC converter including a coil and a capacitor.

Note that, in this specification, a normally-off transistor refers to a transistor in which a drain current flow does not occur when the gate voltage applied to a gate electrode is 0 V and the voltage applied between a source and a drain is at least 1 V. In contrast, a normally-on transistor refers to a transistor in which a drain current flow occurs when the gate voltage applied to a gate electrode is 0 V and the voltage applied between a source and a drain is at least 1 V.

Alternatively, in this specification, a normally-off transistor refers to an n-channel transistor whose threshold voltage is positive or a p-channel transistor whose threshold voltage is negative. In contrast, a normally-on transistor refers to an n-channel transistor whose threshold voltage is negative or a p-channel transistor whose threshold voltage is positive.

Specifically, in this specification, a normally-off transistor refers to an n-channel transistor whose gate voltage is positive when the drain current is $1 \times 10^{-12}$ A according to the measurement of drain current-gate voltage characteristics. In contrast, a normally-on transistor refers to an n-channel transistor whose gate voltage is negative when the drain current is $1 \times 10^{-12}$ A according to the measurement of drain current-gate voltage characteristics.

A diode that is one embodiment of the disclosed invention has a smaller voltage drop than a PN diode. Since the diode that is one embodiment of the disclosed invention has a smaller voltage drop than a PN diode, a voltage applied to the diode to compensate a voltage drop is low, which reduces the power consumption of a converter circuit. A reduction in the power consumption of a converter circuit leads to a reduction in the power consumption of a photoelectric transducer device.

Thus, the use of a diode-connected normally-on transistor as a diode is preferable in that it reduces a voltage drop, needs a low voltage to compensate a voltage drop, reduces the power consumption of a converter circuit, and reduces the power consumption of a photoelectric transducer device.

Further, a rectifier and a switching element included in a converter circuit can be fabricated using the same material and in the same process.

Since a rectifier and a switching element which are included in a converter circuit can be fabricated using the same material and in the same process, the fabrication cost of the converter circuit can be reduced. Since the fabrication cost of a converter circuit can be reduced, the fabrication cost of a photoelectric transducer device can be reduced.

BRIEF DESCRIPTION OF THE DRAWINGS

FIGS. 6A and 6B are cross-sectional views showing the fabrication method of the insulated gate bipolar transistors.

FIGS. 7A and 7B are cross-sectional views showing the fabrication method of the insulated gate bipolar transistors.

FIGS. 8A and 8B are cross-sectional views showing the fabrication method of the insulated gate bipolar transistors.

DETAILED DESCRIPTION OF THE INVENTION

Figure 1:
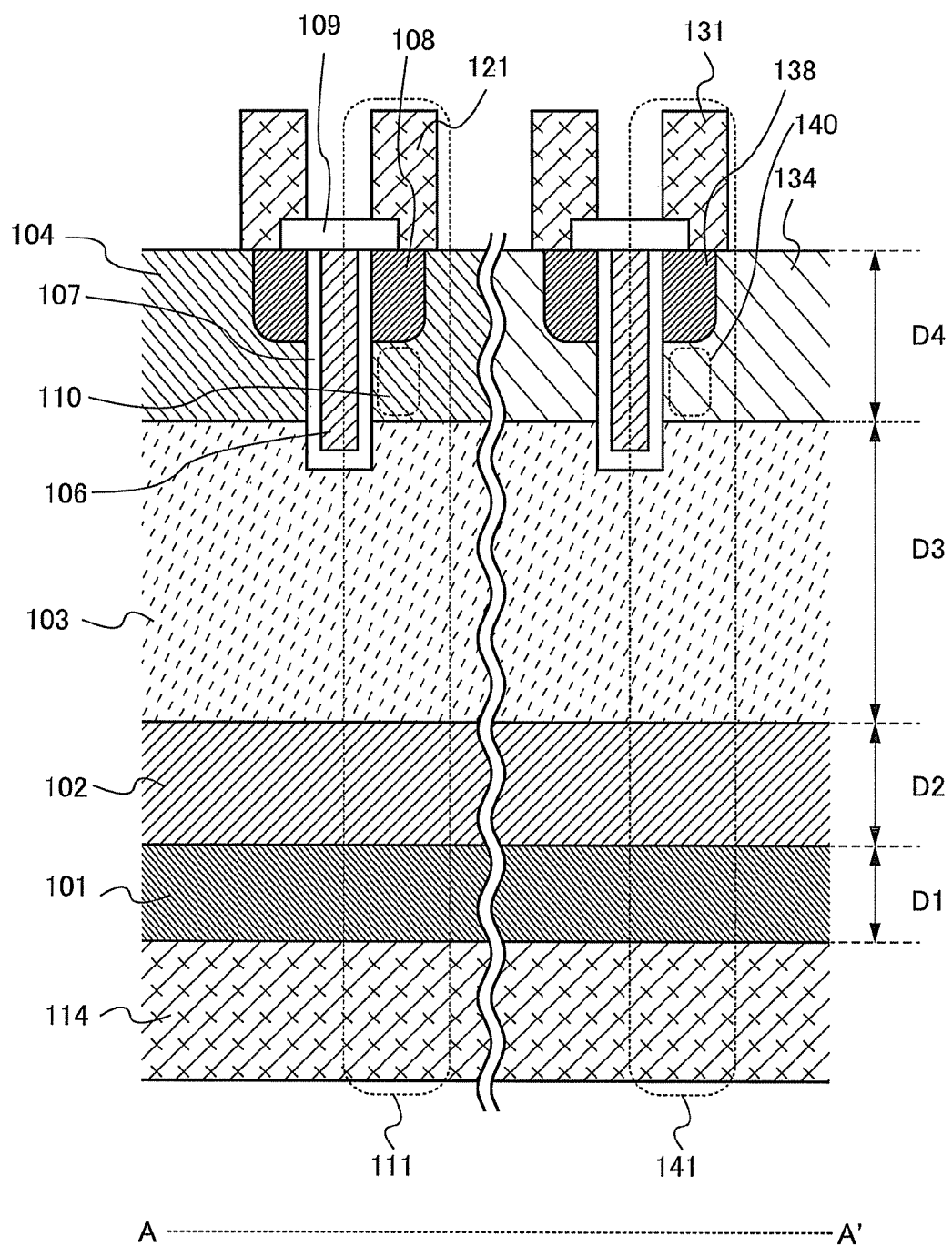
FIG. 1 is a cross-sectional view of insulated gate bipolar transistors.

Embodiments of the disclosed invention will be described below in detail with reference to the drawings. Note that the disclosed invention can be implemented with various modes. It will be readily appreciated by those skilled in the art that modes and details of the disclosed invention can be modified in various ways without departing from the spirit and scope of the present invention. Note that in the drawings, the same portions or portions having a similar function are denoted by the same reference numeral, and repetitive description will be omitted.

Embodiment 1

A photoelectric transducer device of this embodiment will be described with reference to FIG. 1, FIG. 2, FIGS. 3A and 3B, FIG. 4, FIG. 5A and 5B, FIGS. 6A and 6B, FIGS. 7A and 7B, FIGS. 8A and 8B, FIG. 9, FIG. 10, FIG. 11, FIG. 12, FIG. 13, FIG. 14, and FIG. 19.

An example of the converter circuit of this embodiment will be described with reference to FIGS. 3A and 3B. The converter circuit of this embodiment is a DC-DC converter that converts DC voltage into DC voltage.

Figure 3A:
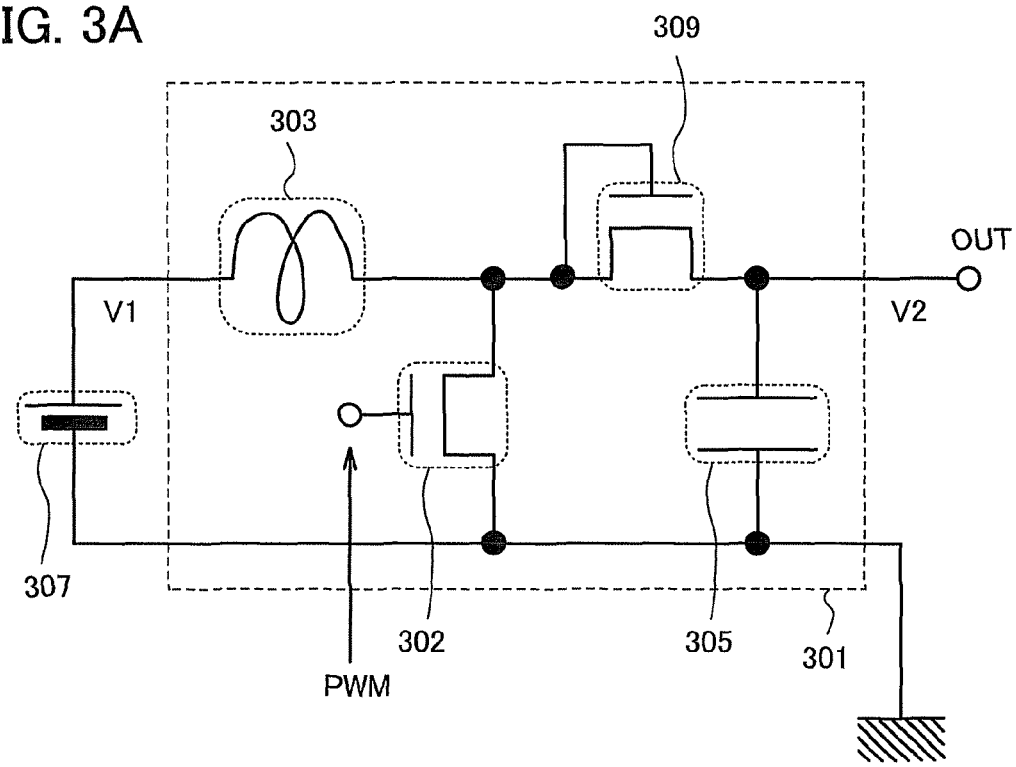
FIGS. 3A and 3B are circuit diagrams of converter circuits.

A converter circuit 301 shown in FIG. 3A is a step-up circuit including a transistor 302 which is a switching element, a coil 303, a diode 309 which is a rectifier, and a capacitor 305.

One terminal of the coil 303 is electrically connected to one of the electrodes of a photoelectric transducer element 307, which electrodes are on the n-type semiconductor layer side and on the p-type semiconductor layer side of the element. The other terminal of the coil 303 is electrically connected to one of a source and a drain of the transistor 302. The one of the source and the drain of the transistor 302 is electrically connected to the other terminal of the coil 303 and an input terminal of the diode 309. The other of the source and the drain of the transistor 302 is electrically connected to the other of the electrodes of the photoelectric transducer element 307, which electrodes are on the n-type semiconductor layer side and on the p-type semiconductor layer side of the element, and to one terminal of the capacitor 305. The other terminal of the capacitor 305 is electrically connected to an output terminal of the diode 309 and to an output terminal OUT. Note that the other of the electrodes of the photoelectric transducer element 307, which electrodes are on the n-type semiconductor layer side and on the p-type semiconductor layer side of the element, the other of the source and the drain of the transistor 302, and the one terminal of the capacitor 305 are grounded.

Note that the gate of the transistor refers to the entire or part of the gate electrode and gate wiring. The gate wiring refers to wiring for electrically connecting the gate electrode of at least one transistor to a different electrode or different wiring.

The source of the transistor refers to the entire or part of the source region, source electrode, and source wiring. The source region refers to a region whose resistance is lower than that of a channel formation region in a semiconductor layer. The source electrode refers to part of a conductive layer, which is connected to the source region. The source wiring is wiring for electrically connecting the source electrode of at least one transistor to a different electrode or different wiring.

The drain of the transistor refers to the entire or part of the drain region, drain electrode, and drain wiring. The drain region refers to a region whose resistance is lower than that of a channel formation region in a semiconductor layer. The drain electrode refers to part of a conductive layer, which is connected to the drain region. The drain wiring is wiring for electrically connecting the drain electrode of at least one transistor to a different electrode or different wiring.

Further, in Embodiment 1, the source and the drain of a transistor may interchange with each other depending on the structure, the operating condition, and the like of the transistor; therefore, it is difficult to define which is the source or the drain. For this reason, in this document (the specification, the claims, the drawings, or the like), one of the source and the drain is referred to as one of the source and the drain, and the other is referred to as the other of the source and the drain.

The transistor 302 functions as a switching element. A gate of the transistor 302 is connected to a control circuit of the converter circuit 301. The transistor 302 is turned on and off by a signal output from the control circuit of the converter circuit 301.

When the transistor 302 which is a switching element is on, excitation energy is accumulated in the coil 303 by current flowing to the coil 303.

When the transistor 302 is turned off, excitation energy accumulated in the coil 303 is released. A voltage V2 due to excitation energy released from the coil 303 is added to a voltage V1. Thus, the converter circuit 301 functions as a step-up circuit.

A period in which the transistor 302 which is a switching element is on is $T_{on}$ and a period in which the transistor 302 is off is $T_{off}$. The value of the output voltage V2 is expressed by Formula 1 below.

$$V2 = V1 \times (T_{on} + T_{off})/T_{off} \quad \text{(Formula 1)}$$

The longer the period $T_{on}$ in which the transistor 302 is on and the larger the energy accumulated in the coil 303, the larger the power taken is.

In Embodiment 1, a normally-off insulated gate bipolar transistor (IGBT) is used as the transistor 302. Note that the specific structure and fabrication method of the insulated gate bipolar transistor will be described later.

An insulated gate bipolar transistor is a power transistor having an input in the MOS structure and an output in the bipolar structure and is a high-voltage high-current transistor. For this reason, such an insulated gate bipolar transistor is preferably used as the transistor 302 which serves as a switching element in the converter circuit 301.

In Embodiment 1, the diode 309 functions as a rectifier. In Embodiment 1, a diode-connected insulated gate bipolar transistor is used as the diode 309. An insulated gate bipolar transistor that is the same as the transistor 302 except that it has a gate electrode and a drain region electrically connected to each other is used as the diode-connected insulated gate bipolar transistor. The diode 309 is a diode-connected normally-on insulated gate bipolar transistor. The collector current of a normally-on insulated gate bipolar transistor rises soon after a gate voltage is applied to a gate electrode. Thus, a diode that is a diode-connected normally-on insulated gate bipolar transistor is preferable in that it has a smaller voltage drop than a PN diode.

A normally-off insulated gate bipolar transistor that is the transistor 302 and a normally-on insulated gate bipolar transistor that is the diode 309 are different only in impurity concentration in the channel formation region. The transistor 302 and the diode 309 can therefore be fabricated in the same process. Thus, the number of fabrication steps of the converter circuit 301 can be reduced. Since the number of the fabrication steps of the converter circuit 301 can be reduced, the fabrication cost of the converter circuit 301 can be reduced.

As described above, an insulated gate bipolar transistor is a high-voltage high-current transistor. For this reason, a diode-connected insulated gate bipolar transistor is preferably used as the diode 309 in the converter circuit 301.

In Embodiment 1, a coiled wire formed over a substrate can be used as the coil 303.

In Embodiment 1, a capacitor having a first electrode, a second electrode, and a dielectric, for example, can be used as the capacitor 305.

Figure 2:
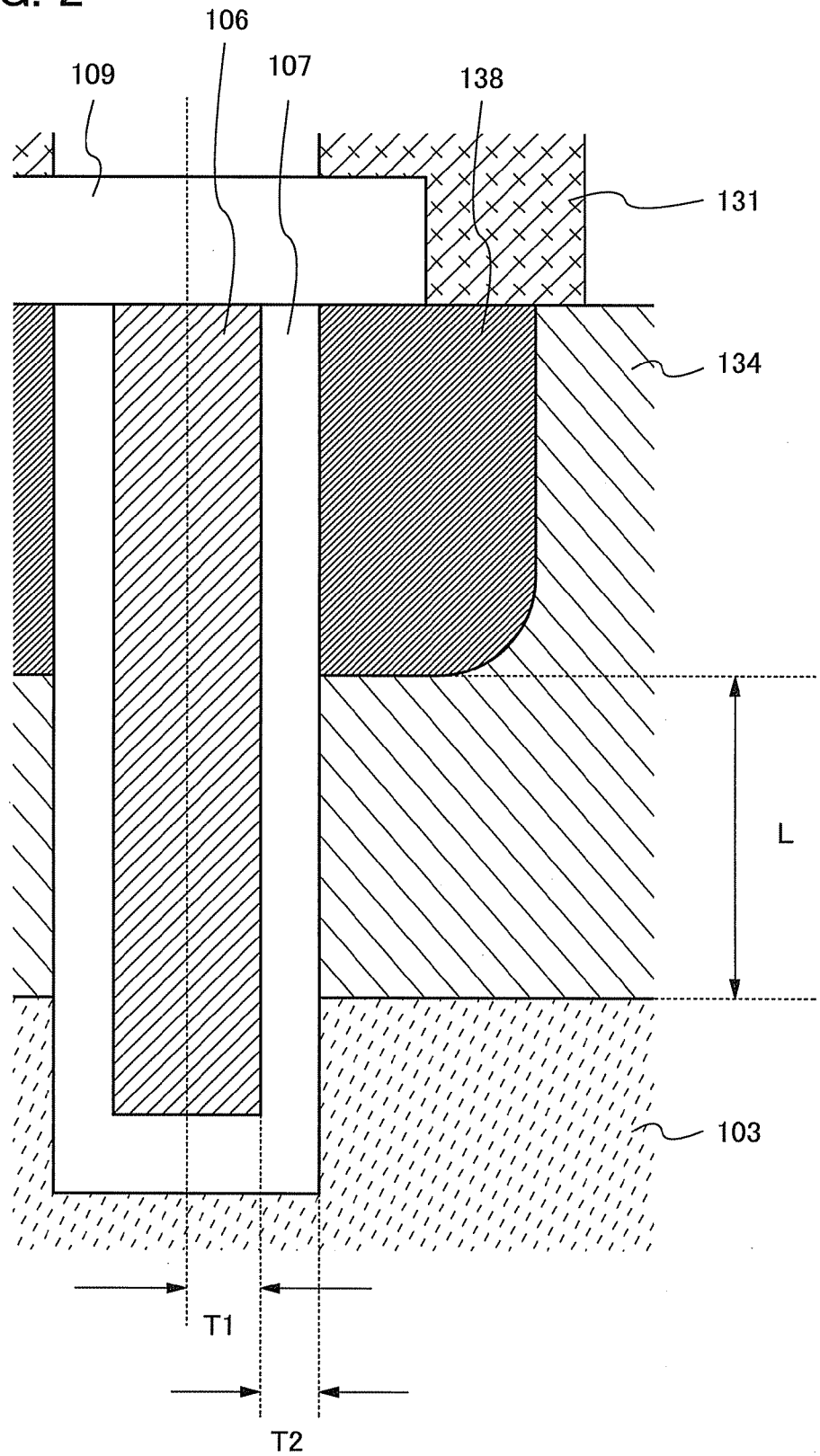
FIG. 2 is a cross-sectional view of the insulated gate bipolar transistor.
Figure 10:
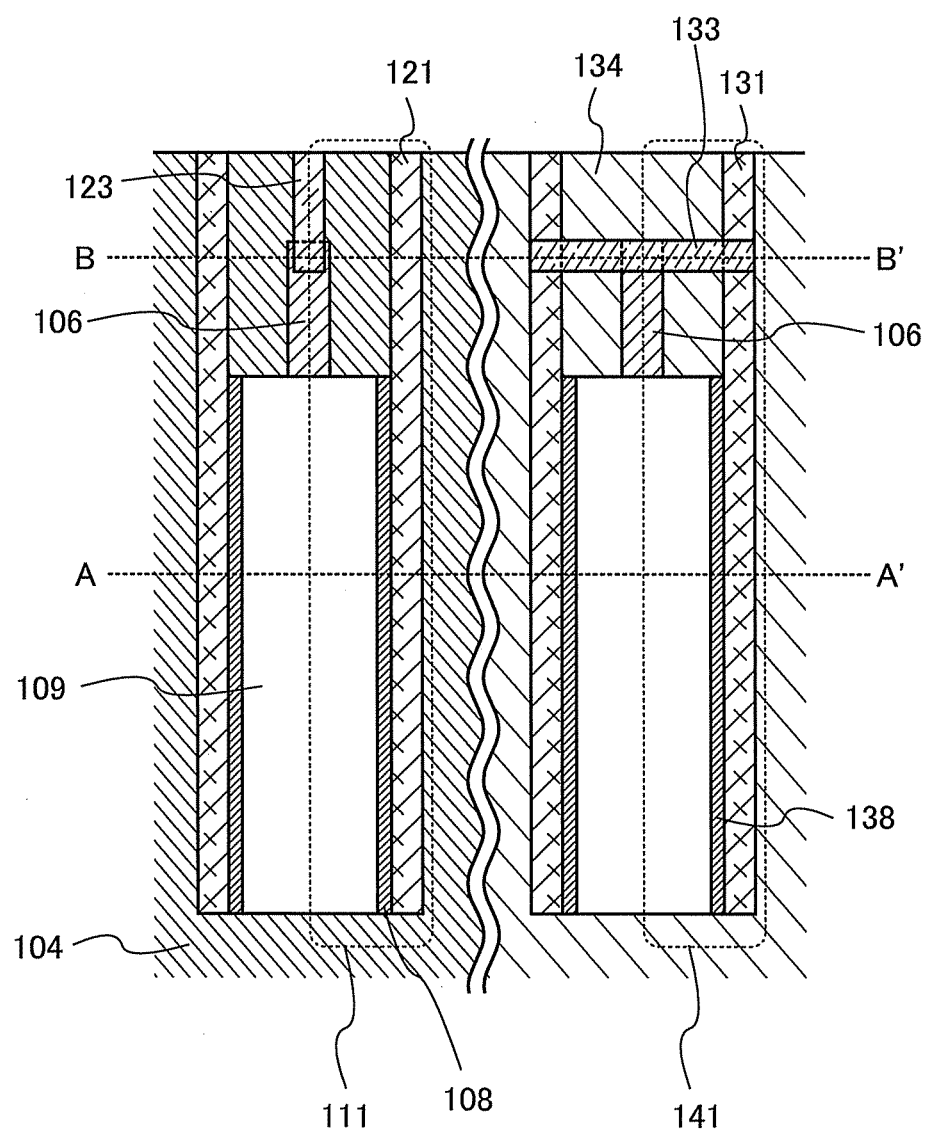
FIG. 10 is a top view of the insulated gate bipolar transistors.
Figure 12:
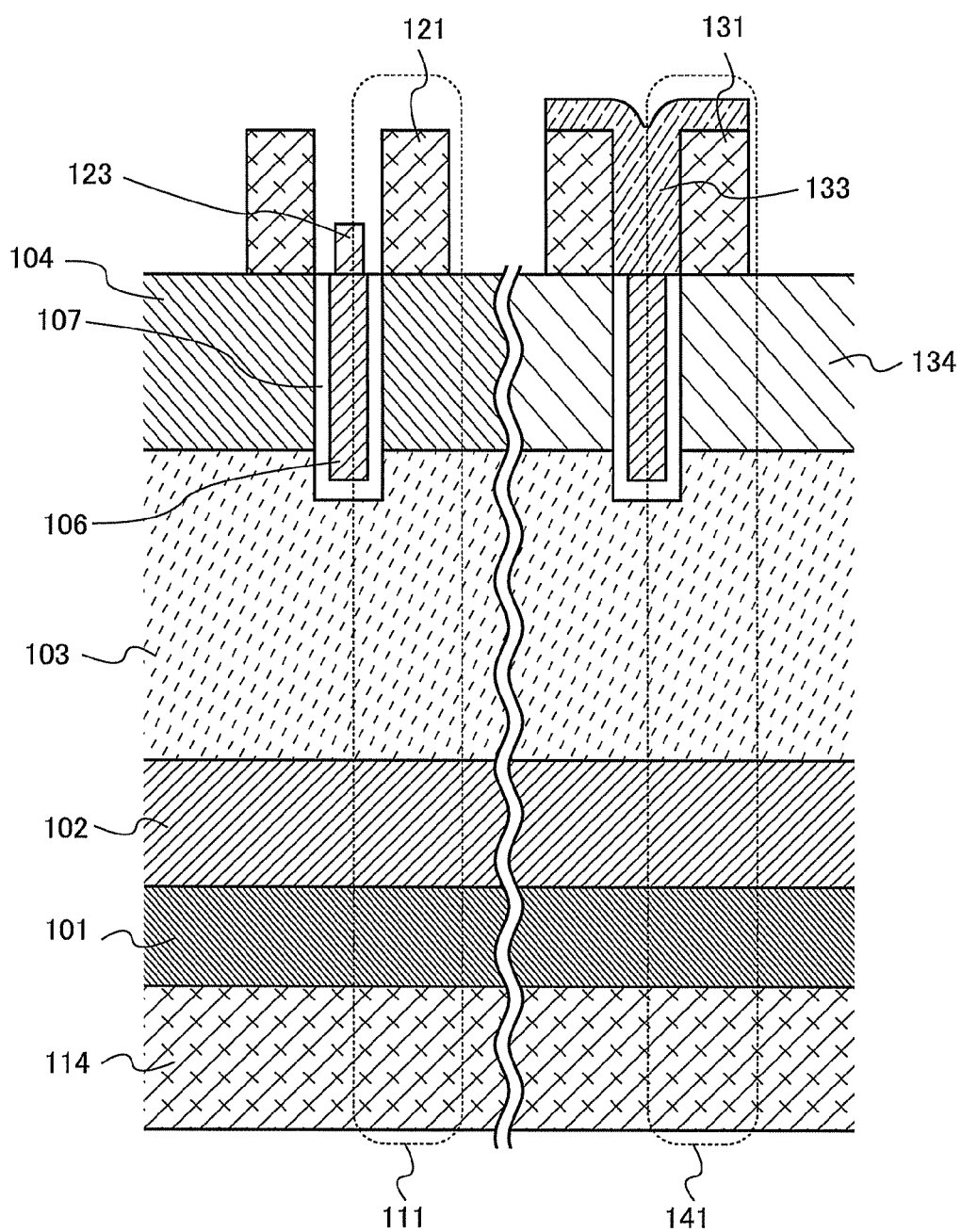
FIG. 12 is a cross-sectional view of the insulated gate bipolar transistors.

An example of an insulated gate bipolar transistor of Embodiment 1 will be shown in FIG. 1, FIG. 2, FIG. 10, and FIG. 12. FIG. 1 is a cross-sectional view of an insulated gate bipolar transistor 111 and a diode-connected insulated gate bipolar transistor 141. FIG. 2 is an enlarged view of a part of the insulated gate bipolar transistor 111 shown in FIG. 1. FIG. 10 is a top view of the insulated gate bipolar transistor 111 and the diode-connected insulated gate bipolar transistor 141 shown in FIG. 1. FIG. 1 is a cross-sectional view along section A-A' shown in FIG. 10. FIG. 12 is a cross-sectional view along section B-B' shown in FIG. 10.

The insulated gate bipolar transistor 111 shown in FIG. 1 includes a conductive film 114, a first heavily doped region 101, a second heavily doped region 102, a first lightly doped region 103, a second lightly doped region 104, an insulating film 109, and a conductive film 121. The insulated gate bipolar transistor 111 includes a gate electrode 106 and a gate insulating film 107 embedded in the first lightly doped region 103 and the second lightly doped region 104. Further, a third heavily doped region 108 is formed in the second lightly doped region 104. The first heavily doped region 101 and the second lightly doped region 104 contain a first impurity element giving a first conductivity type. The second heavily doped region 102, the first lightly doped region 103, and the third heavily doped region 108 contain a second impurity element giving a second conductivity type that is an opposite conductivity type to the first conductivity type.

In Embodiment 1, the first conductivity type is p-type, and the second conductivity type is n-type. In other words, the first heavily doped region 101 is a p-type heavily doped region; the second heavily doped region 102 is an n-type heavily doped region; the first lightly doped region 103 is an n-type lightly doped region; the second lightly doped region 104 is a p-type lightly doped region; the third heavily doped region 108 is an n-type heavily doped region.

Note that the first conductivity type and the second conductivity type can interchange with each other. In other words, the first conductivity type may be n-type, and the second conductivity type may be p-type. In this case, the first heavily doped region 101 is an n-type heavily doped region; the second heavily doped region 102 is a p-type heavily doped region; the first lightly doped region 103 is a p-type lightly doped region; the second lightly doped region 104 is an n-type lightly doped region; the third heavily doped region 108 is a p-type heavily doped region.

The third heavily doped region 108 functions as an emitter region. The first heavily doped region 101 functions as a collector region.

The conductive film 121 functions as an emitter electrode, and the conductive film 114 functions as a collector electrode.

A channel formation region 110 is formed in a region between the third heavily doped region 108 formed in the second lightly doped region 104 and the gate electrode 106. In other words, the channel formation region 110 and the second lightly doped region 104 contain the same impurity element and have the same concentration of the impurity element.

Like the insulated gate bipolar transistor 111, the insulated gate bipolar transistor 141 shown in FIG. 1 includes the conductive film 114, the first heavily doped region 101, the second heavily doped region 102, the first lightly doped region 103, the insulating film 109, and the conductive film 131. Note that the insulated gate bipolar transistor 141 includes a second lightly doped region 134 instead of the second lightly doped region 104, unlike the insulated gate bipolar transistor 111.

The insulated gate bipolar transistor 141 includes the gate electrode 106 and the gate insulating film 107 embedded in the first lightly doped region 103 and the second lightly doped region 134. Further, a third heavily doped region 138 is formed in the second lightly doped region 134. The third heavily doped region 138 contains an impurity element giving the same conductivity type as the impurity element contained in the third heavily doped region 108, and the third heavily doped region 138 and the third heavily doped region 108 have the same impurity concentration.

A channel formation region 140 is formed in a region between the third heavily doped region 138 formed in the second lightly doped region 134 and the gate electrode 106. In other words, the channel formation region 140 and the second lightly doped region 134 contain the same impurity element and have the same concentration of the impurity element.

The concentration of the first impurity element contained in the channel formation region 140, that is, the concentration of the first impurity element contained in the second lightly doped region 134 is controlled to keep the insulated gate bipolar transistor 141 normally on. On the other hand, the concentration of the first impurity element contained in the channel formation region 110, that is, the concentration of the first impurity element contained in the second lightly doped region 104 is controlled to keep the insulated gate bipolar transistor 111 normally off.

In other words, the first impurity element contained in the channel formation region 110 and that contained in the channel formation region 140 are at different concentrations. Each concentration determines whether the insulated gate bipolar transistor is normally off or normally on.

Therefore, the normally-off insulated gate bipolar transistor and the normally-on insulated gate bipolar transistor can be differently formed by only differentiating impurity concentration between the channel formation region 110 and the channel formation region 140.

Note that, in the insulated gate bipolar transistor 141, the third heavily doped region 138 functions as an emitter region. The first heavily doped region 101 functions as a collector region.

Note that, in the insulated gate bipolar transistor 141, the conductive film 131 functions as an emitter electrode, and the conductive film 114 functions as a collector electrode.

The conductive film 131 in the insulated gate bipolar transistor 141 and the conductive film 121 in the insulated gate bipolar transistor 111 can be fabricated using the same material and in the same fabrication process.

Note that the insulated gate bipolar transistor 111 and the insulated gate bipolar transistor 141 do not need to be insulated from one another when a voltage applied between the conductive film 121 and the conductive film 114 which are included in the insulated gate bipolar transistor 111 is the same as a voltage applied between the conductive film 131 and the conductive film 114 which are included in the insulated gate bipolar transistor 141.

Note that the insulated gate bipolar transistor 111 and the insulated gate bipolar transistor 141 need to be insulated from one another when a voltage applied between the conductive film 121 and the conductive film 114 which are included in the insulated gate bipolar transistor 111 is different from a voltage applied between the conductive film 131 and the conductive film 114 which are included in the insulated gate bipolar transistor 141. In this case, an insulator is formed between the insulated gate bipolar transistor 111 and the insulated gate bipolar transistor 141. The conductive film 114 may be divided in accordance with each insulated gate bipolar transistor 111 and each insulated gate bipolar transistor 141 if necessary.

FIG. 10 is a top view of the insulated gate bipolar transistor 111 and the insulated gate bipolar transistor 141 shown in FIG. 1. FIG. 1 is a cross-sectional view along section A-A' shown in FIG. 10, and FIG. 12 is a cross-sectional view along section B-B' shown in FIG. 10.

As shown in FIG. 10, in the insulated gate bipolar transistor 111, the gate electrode 106 is connected to a conductive film 123. In other words, the insulated gate bipolar transistor 111 functions as a transistor. On the other hand, in the insulated gate bipolar transistor 141, the gate electrode 106, and the third heavily doped region 138 are electrically connected to each other through the conductive film 131 and a conductive film 133. In other words, the insulated gate bipolar transistor 141 is diode-connected, and functions as a diode.

FIG. 12 is a cross-sectional view along section B-B' shown in FIG. 10 as described above. In the insulated gate bipolar transistor 111, the gate electrode 106 is connected to the conductive film 123 as stated above. On the other hand, in the insulated gate bipolar transistor 141, the gate electrode 106 is electrically connected to the conductive film 131 and the conductive film 133.

Note that the conductive film 123 in the insulated gate bipolar transistor 111 and the conductive film 133 in the insulated gate bipolar transistor 141 can be formed using the same material and in the same fabrication process. Alternatively, they can be formed using different materials and in different fabrication processes.

The fabrication method of the insulated gate bipolar transistor 111 of Embodiment 1 will be described with reference to FIGS. 5A and 5B, FIGS. 6A and 6B, FIGS. 7A and 7B, FIGS. 8A and 8B, and FIG. 9. Note that the fabrication process of the insulated gate bipolar transistor 141 is similar to that of the insulated gate bipolar transistor 111 except for the process performed after the insulating film 109 is fabricated. For the fabrication process up to the fabrication of the insulating film 109, the fabrication process of the insulated gate bipolar transistor 141 is different from that of the insulated gate bipolar transistor 111 in forming the second lightly doped region 134 instead of the second lightly doped region 104.

First, an n-type single crystal semiconductor substrate to be the second heavily doped region 102 is prepared. In Embodiment 1, an n-type single crystal silicon substrate is used as the n-type single crystal semiconductor substrate.

Next, the first lightly doped region 103 is formed on one surface of the n-type single crystal semiconductor substrate by using epitaxial growth. In Embodiment 1, an epitaxially grown n-type silicon layer is used as the first lightly doped region 103.

Figure 5A:
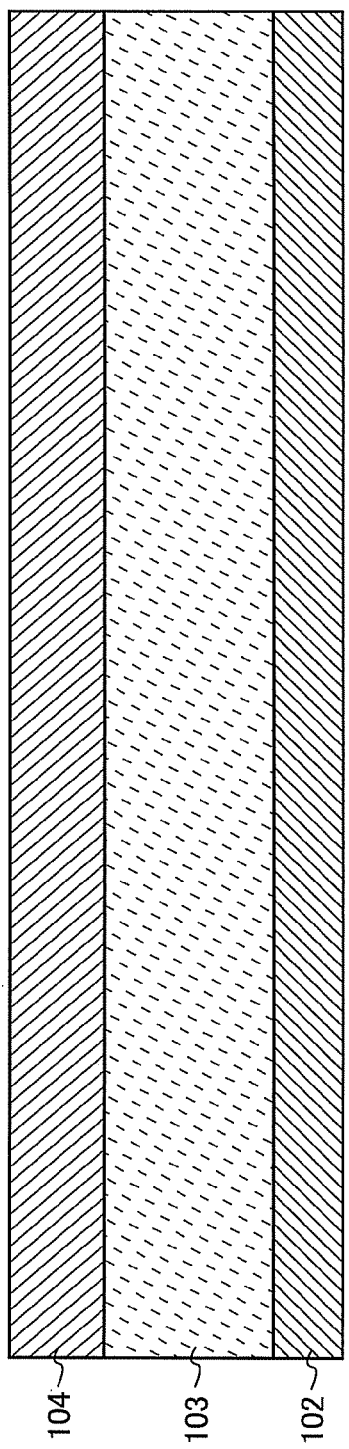
FIGS. 5A and 5B are cross-sectional views showing a fabrication method of the insulated gate bipolar transistors.

Then, the second lightly doped region 104 is formed over the first lightly doped region 103 by using epitaxial growth (see FIG. 5A). In Embodiment 1, an epitaxially grown p-type silicon layer is used as the second lightly doped region 104.

Note that, as described above, FIGS. 5A and 5B, FIGS. 6A and 6B, FIGS. 7A and 7B, FIGS. 8A and 8B, and FIG. 9 show the fabrication process of the insulated gate bipolar transistor 111. To fabricate the insulated gate bipolar transistor 141, the second lightly doped region 134 should be formed instead of the second lightly doped region 104. Note that the concentration of an impurity element contained in the second lightly doped region 104 and that of an impurity element contained in the second lightly doped region 134 are different.

Figure 5B:
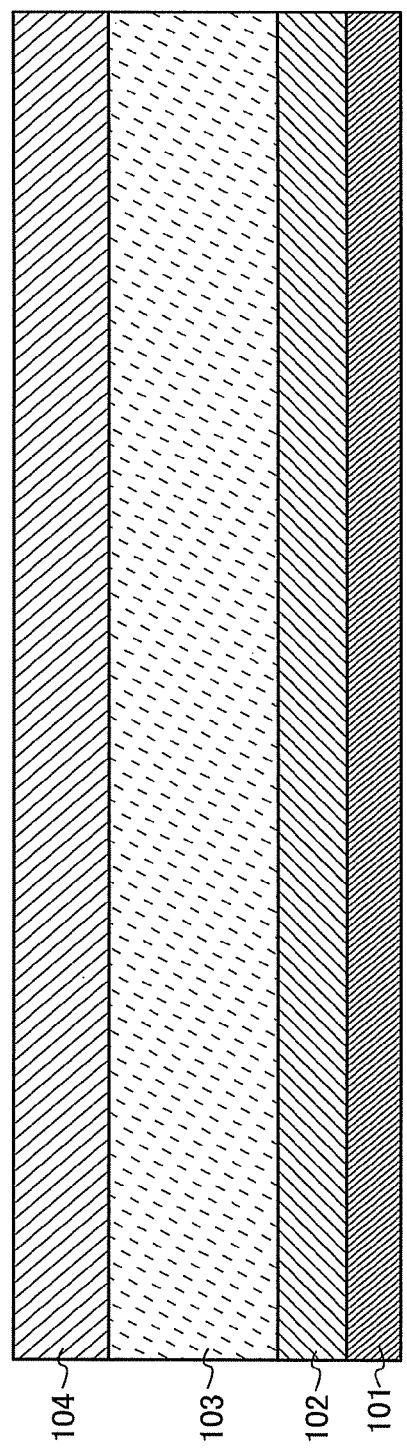

The first heavily doped region 101 is formed over the other surface of the n-type single crystal semiconductor substrate (see FIG. 5B). In Embodiment 1, an epitaxially grown p-type silicon layer is used as the first heavily doped region 101.

The concentration of an impurity element giving n-type conductivity contained in the second heavily doped region 102 is higher than that of an impurity element giving n-type conductivity contained in the first lightly doped region 103. Phosphorus (P) or arsenic (As) is used as the impurity element giving n-type conductivity.

The concentration of an impurity element giving p-type conductivity contained in the first heavily doped region 101 is higher than that of an impurity element giving p-type conductivity contained in the second lightly doped region 104. Boron (B) is used as the impurity element giving p-type conductivity.

Then, a mask 112 is formed over the second lightly doped region 104. Part of the second lightly doped region 104 and the first lightly doped region 103 is removed using the mask 112, thereby forming grooves 113 in the second lightly doped region 104 and the first lightly doped region 103 (see FIG. 6A).

An insulating film 115 and a conductive film 116 are formed to cover the second lightly doped region 104, the first lightly doped region 103, and the grooves 113 (see FIG. 6B).

Next, part of the insulating film 115 and the conductive film 116 is removed to expose the second lightly doped region 104. Further a surface of the insulating film 115 part of which is removed (hereinafter called a gate insulating film 107) and a surface of the conductive film 116 part of which is removed (hereinafter called a gate electrode 106) are also exposed (see FIG. 7A).

A mask 117 is formed over the exposed second lightly doped region 104, the exposed gate electrode 106, and the exposed gate insulating film 107. An impurity element 118 giving n-type conductivity is added to the second lightly doped region 104 by using the mask 117 (see FIG. 7B).

The third heavily doped region 108 is formed in the second lightly doped region 104 by the above-described step of adding the impurity element 118 giving n-type conductivity to the second lightly doped region 104 (see FIG. 8A). The concentration of the impurity element 118 giving n-type conductivity contained in the third heavily doped region 108 is higher than that of the impurity element 118 contained in the first lightly doped region 103.

Then, the insulating film 109 is formed over part of the third heavily doped region 108, the gate electrode 106, and the gate insulating film 107 (see FIG. 8B).

Figure 9:
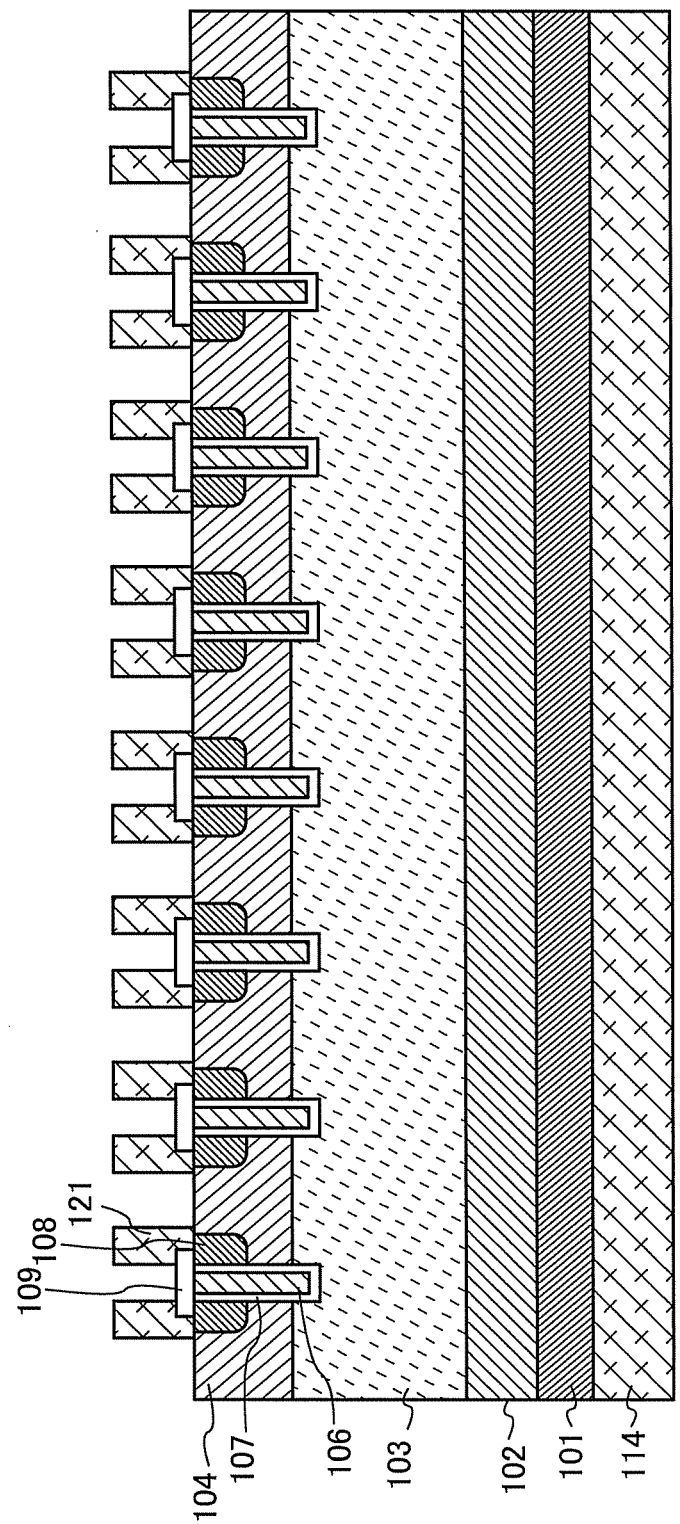
FIG. 9 is a cross-sectional view showing the insulated gate bipolar transistors.

The conductive film 121 is formed in contact with an exposed region of the third heavily doped region 108 (see FIG. 9). Thus, the insulated gate bipolar transistor 111 is formed.

Figure 13:
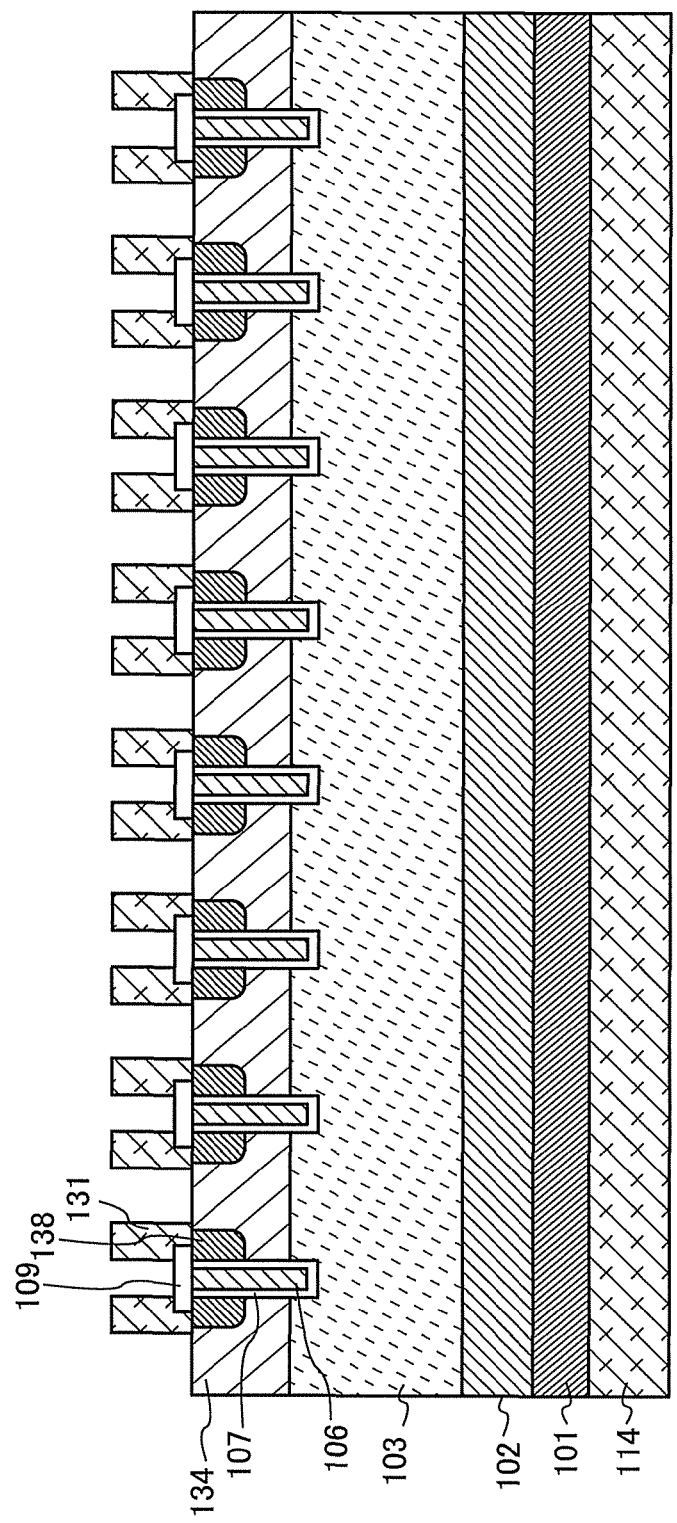
FIG. 13 is a cross-sectional view of the insulated gate bipolar transistors.

Note that to fabricate the insulated gate bipolar transistor 141, the conductive film 131 is formed in contact with an exposed region of the third heavily doped region 138 (see FIG. 13). Thus, the insulated gate bipolar transistor 141 is fabricated.

As described above, in the insulated gate bipolar transistor 111, the gate electrode 106 is electrically connected to the conductive film 123. The third heavily doped region 108 in the insulated gate bipolar transistor 111 is electrically connected to the conductive film 121.

The gate electrode 106 in the insulated gate bipolar transistor 141 is electrically connected to the conductive film 133. The third heavily doped region 108 in the insulated gate bipolar transistor 141 is electrically connected to the conductive film 131. The conductive film 131 is electrically connected to the conductive film 133. In other words, the gate electrode 106 in the insulated gate bipolar transistor 141 is electrically connected to the third heavily doped region 108 through the conductive film 131 and the conductive film 133.

The benefits to using a normally-off insulated gate bipolar transistor as a transistor serving as a switching element, and a diode-connected normally-on insulated gate bipolar transistor as a diode will be described below.

As described in SUMMARY OF THE INVENTION, a voltage drop occurs across a PN diode when a voltage is applied to the PN diode. A forward voltage drop across a PN diode ranges from 0.6 eV to 0.8 eV.

However, the collector current Ic of a normally-on insulated gate bipolar transistor rises soon after a gate voltage Vg is applied to a gate electrode. Therefore, a diode that is a diode-connected normally-on insulated gate bipolar transistor is preferable in that it has a smaller voltage drop than a PN diode.

A diode-connected normally-on insulated gate bipolar transistor has a smaller voltage drop than a PN diode, and thus needs a low voltage applied to compensate a voltage drop. A diode-connected normally-on insulated gate bipolar transistor needs a low voltage to compensate a voltage drop, and thus achieves the low power consumption of the photoelectric transducer device.

Thus, the use of a diode-connected normally-on gate insulated bipolar transistor as a diode is preferable in that it reduces a voltage drop, needs a low voltage to compensate a voltage drop, and reduces the power consumption of the photoelectric transducer device.

Figure 4:
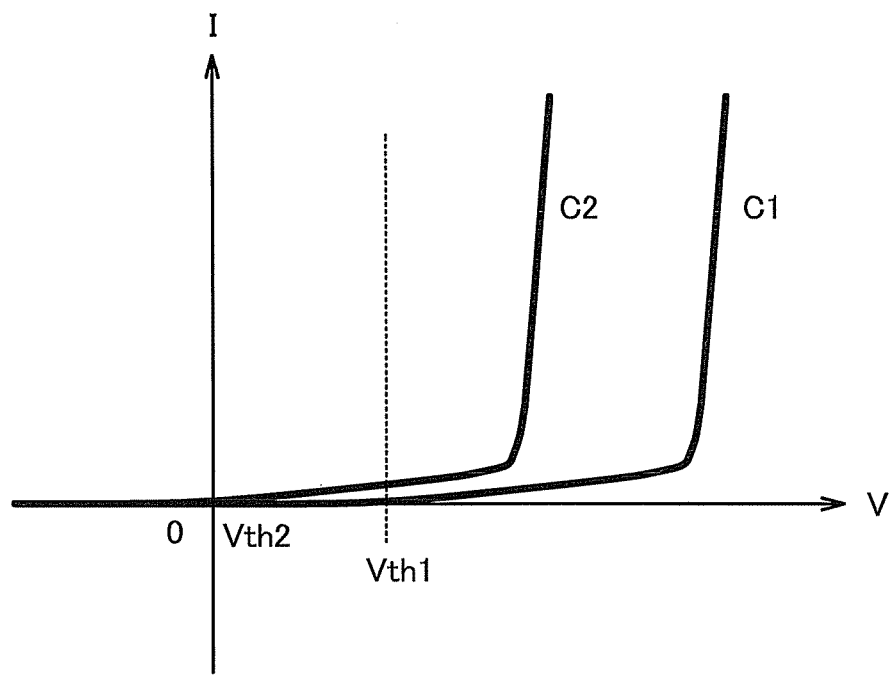
FIG. 4 is a diagram showing a difference between a normally-on transistor and a normally-off transistor.

FIG. 4 shows the V-I curve of a normally-off insulated gate bipolar transistor, C1, and the V-I curve of a normally-on insulated gate bipolar transistor, C2. The threshold voltage of the normally-off insulated gate bipolar transistor, Vth1, is higher than 0 (Vth1>0), and the threshold voltage of the normally-on insulated gate bipolar transistor, Vth2, is 0 or less (Vth2≤0). Note that the lower the threshold voltage of the normally-on insulated gate bipolar transistor, Vth2, the higher the leakage current of the normally-on insulated gate bipolar transistor. For this reason, the threshold voltage of the normally-on insulated gate bipolar transistor, Vth2, is preferably approximately 0 (Vth2=0).

The normally-off insulated gate bipolar transistor and the normally-on insulated gate bipolar transistor can be differently formed by differentiating impurity concentration between the second lightly doped region 104 and the second lightly doped region 134.

Figure 11:
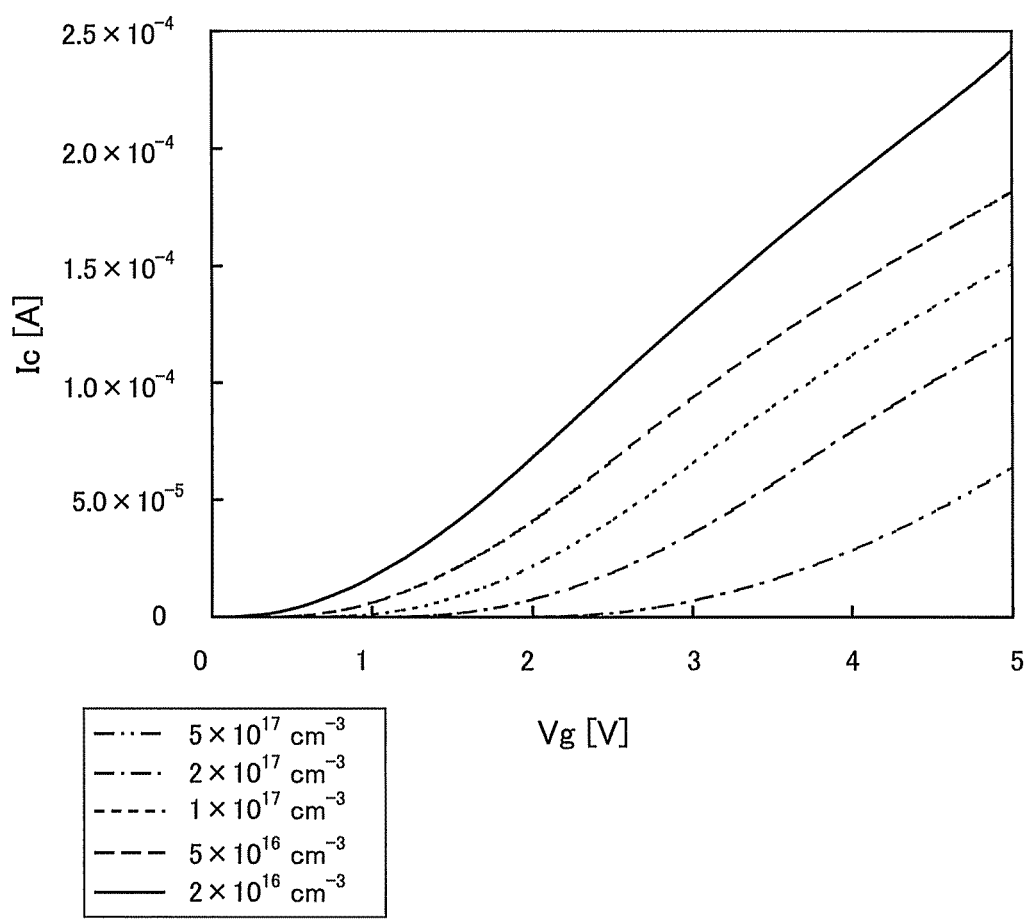
FIG. 11 is a graph showing a relation between the gate voltage and the collector current.

FIG. 11 shows the results of the calculation of the border between the impurity concentration that makes a transistor normally on and the impurity concentration that makes a transistor normally off.

In this calculation, for the insulated gate bipolar transistor 141, the definition of the thickness of each region or the concentration of an impurity element contained in such regions will be described below with reference to FIG. 1 and FIG. 2.

The thickness of the first heavily doped region 101, D1, is 0.5 µm. The thickness of the second heavily doped region 102, D2, is 2.5 µm. The thickness of the first lightly doped region 103, D3, is 64 µm. The thickness of the second lightly doped region 134, D4, is 3 µm. The channel length L is 2.4 µm. One-half the thickness of the gate electrode 106, T1, is 0.7 µm. The thickness of the gate insulating film, T2, is 20 nm. Impurity concentration in the third heavily doped region 108 is $1 \times 10^{21}$ cm$^{-3}$ maximum. Impurity concentration in the first lightly doped region 103 is $1 \times 10^{15}$ cm$^{-3}$. Impurity concentration in the second heavily doped region 102 is $1 \times 10^{19}$ cm$^{-3}$ maximum. Impurity concentration in the first heavily doped region 101 is $1 \times 10^{20}$ cm$^{-3}$ maximum. The reason why the maximum impurity concentrations have been stated is that impurity concentration is varied region by region in each of the first heavily doped region 101, the second heavily doped region 102, and the third heavily doped region 108.

As shown in FIG. 11, when impurity concentration in the channel formation region 140 is $2 \times 10^{16}$ cm$^{-3}$ or less, the insulated gate bipolar transistor 141 is normally on. Such a diode, that is, a normally-on insulated gate bipolar transistor 141 which is diode-connected is preferable in that its collector current Ic quickly rises.

To obtain the normally-off insulated gate bipolar transistor 111, impurity concentration in the channel formation region 110 should be set higher than $2 \times 10^{16}$ cm$^{-3}$.

As described above, according to Embodiment 1, the insulated gate bipolar transistor can be made normally on or normally off by differentiating impurity concentration in the channel formation region without changing the stacking structure of the insulated gate bipolar transistor.

Figure 3B:
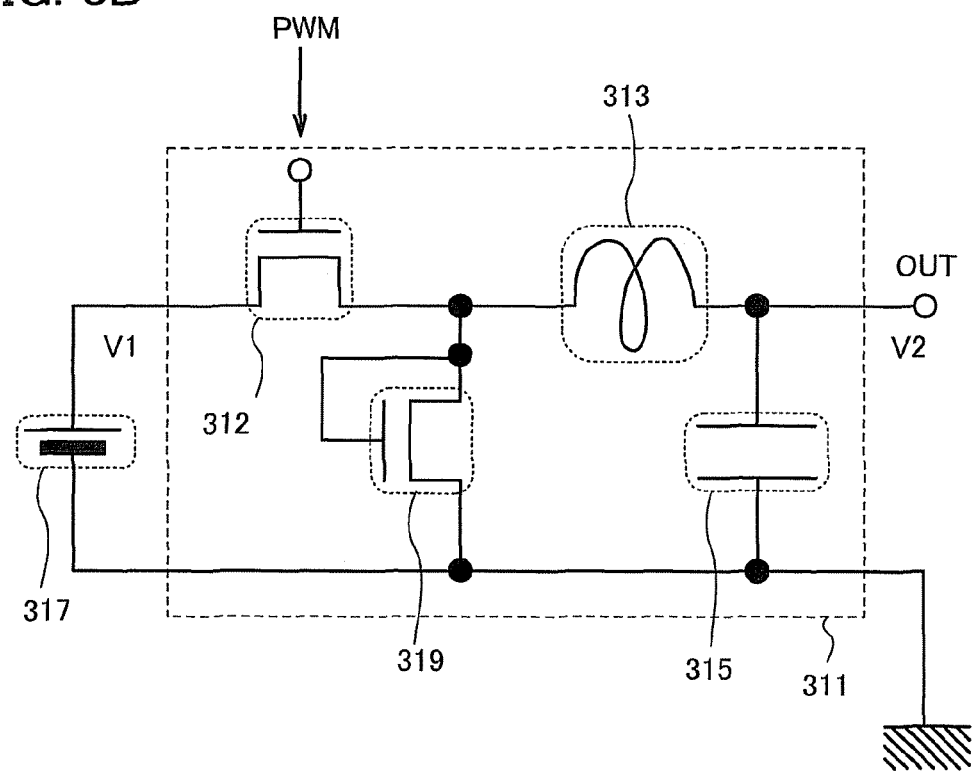

A converter circuit 311 shown in FIG. 3B is a step-down circuit including a transistor 312, a coil 313, a diode 319, and a capacitor 315.

One of a source and a drain of the transistor 312 is electrically connected to one of the electrodes of a photoelectric transducer element 317 which electrodes are on the n-type semiconductor layer side and on the p-type semiconductor layer side of the element. The other of the source and the drain of the transistor 312 is electrically connected to an output terminal of the diode 319 and one terminal of the coil 313. An input terminal of the diode 319 is electrically connected to the other of the electrodes of the photoelectric transducer element 317 which electrodes are on the n-type semiconductor layer side and on the p-type semiconductor layer side of the element, and to one terminal of the capacitor 315. The output terminal of the diode 319 is electrically connected to the other of the source and the drain of the transistor 312 and the one terminal of the coil 313. The one terminal of the coil 313 is electrically connected to the other of the source and the drain of the transistor 312 and the output terminal of the diode 314. The other terminal of the coil 313 is electrically connected to the other terminal of the capacitor 315 and the output terminal OUT. Note that the other of the electrodes of the photoelectric transducer element 317 which electrodes are on the n-type semiconductor layer side and on the p-type semiconductor layer side of the element, the input terminal of the diode 319, and the one terminal of the capacitor 315 are grounded.

The transistor 312 functions as a switching element. A gate of the transistor 312 is connected to a control circuit of the converter circuit 311. The transistor 312 is turned on and off by a signal output from the control circuit of the converter circuit 311.

When the transistor 312 which is a switching element is on, excitation energy is accumulated in the coil 313 by current flowing from the input to the output of the step-down circuit.

When the transistor 312 is turned off, the coil 313 generates electromotive force to keep current, thereby turning on the diode 319. The voltage V2 is decreased by current flowing through the diode 319. The voltage V2 becomes lower than the voltage V1. Consequently, the converter circuit 311 functions as a step-down circuit.

Note that in Embodiment 1, an insulated gate bipolar transistor is used as the transistor 312.

As described above, an insulated gate bipolar transistor is a power transistor having an input in the MOS structure and an output in the bipolar structure and is a high-voltage high-current transistor. For this reason, such an insulated gate bipolar transistor is preferably used as the transistor 312 which is a switching element in the converter circuit 311.

In Embodiment 1, the diode 319 functions as a rectifier. In Embodiment 1, a diode-connected insulated gate bipolar transistor is used as the diode 319. An insulated gate bipolar transistor that has the same structure as the transistor 312 except that it has a gate electrode and a drain region electrically connected to each other is used as the diode-connected insulated gate bipolar transistor. Thus, the transistor 312 and the diode 319 can be fabricated at the same time, which reduces the number of fabrication steps. Since the number of the fabrication steps of the converter circuit 311 can be reduced, the fabrication cost of the converter circuit 311 can be reduced.

As described above, an insulated gate bipolar transistor is a high-voltage high-current transistor. For this reason, a diode-connected insulated gate bipolar transistor is preferably used as the diode 319 in the converter circuit 311.

As described above, a normally-off insulated gate bipolar transistor is used as the transistor 312 which is a switching element. A diode-connected normally-on insulated gate bipolar transistor is used as the diode 319 which is a rectifier. Since the diode 319 is a diode-connected normally-on insulated gate bipolar transistor, it has a smaller voltage drop than a PN diode.

As described above, according to Embodiment 1, the insulated gate bipolar transistor can be made normally on or normally off by differentiating impurity concentration in the channel formation region without changing the stacking structure of the insulated gate bipolar transistor.

In Embodiment 1, a coiled wire formed over a substrate can be used as the coil 313.

In Embodiment 1, a capacitor having a first electrode, a second electrode, and a dielectric, for example, can be used as the capacitor 315.

As described above, in the converter circuit of Embodiment 1, a diode-connected normally-on insulated gate bipolar transistor is used as the diode which is a rectifier. A diode-connected normally-on insulated gate bipolar transistor has a smaller voltage drop than a PN diode, and thus needs a low voltage applied to compensate a voltage drop. A diode-connected normally-on insulated gate bipolar transistor needs a low voltage to compensate a voltage drop, and thus achieves the low power consumption of the converter circuit. A reduction in the power consumption of the converter circuit leads to a reduction in the power consumption of the photoelectric transducer device.

Note that in the converter circuit of this embodiment, a field-effect transistor (FET), a typical example of which is a metal-oxide semiconductor (MOS) transistor (hereinafter referred to as MOSFET), may be used instead of the insulated gate bipolar transistor. The case where a MOSFET is used instead of the insulated gate bipolar transistor shown in FIG. 1 will be described below.

Figure 19:
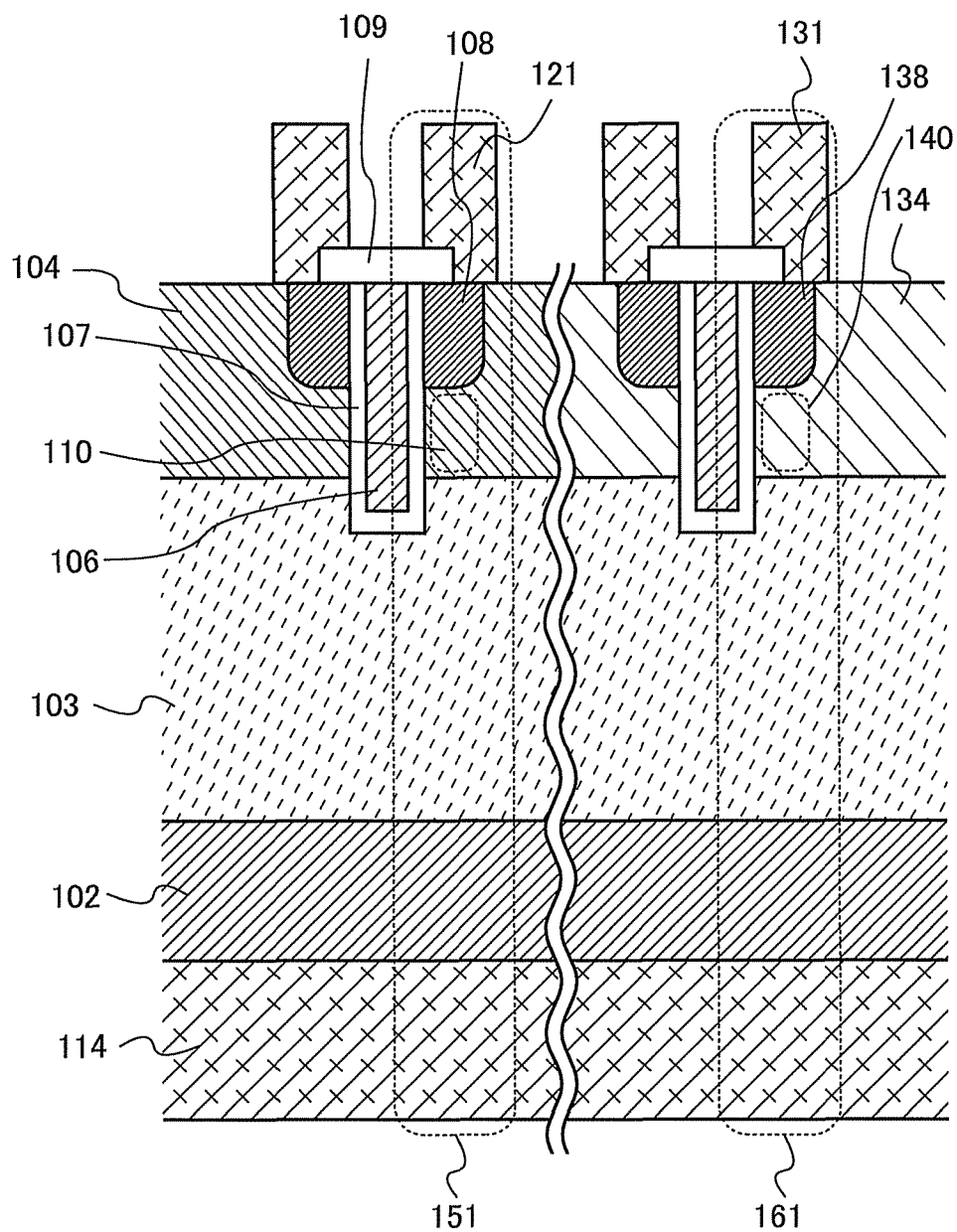
FIG. 19 is a cross-sectional view of a field-effect transistor.

FIG. 19 is a cross-sectional view of a MOSFET 151 and a MOSFET 161. The MOSFET 151 can be used as the transistor 302 shown in FIG. 3A or the transistor 312 shown in FIG. 3B, like the insulated gate bipolar transistor 111 shown in FIG. 1. The MOSFET 161 can be used as the diode 309 shown in FIG. 3A or the diode 319 shown in FIG. 3B, like the insulated gate bipolar transistor 141 shown in FIG. 1.

Note that components in FIG. 19 use the same reference numerals as components in FIG. 1. For the structures or materials of the MOSFET 151 and the MOSFET 161 shown in FIG. 19, see the structures or materials of the insulated gate bipolar transistor 111 and the insulated gate bipolar transistor shown in FIG. 1.

The MOSFET 151 includes a conductive film 114, a heavily doped region 102, a lightly doped region 103, a lightly doped region 104, an insulating film 109, and a conductive film 121. The MOSFET 151 includes a gate electrode 106 and a gate insulating film 107 embedded in the lightly doped region 103 and the lightly doped region 104. Further, a heavily doped region 108 is formed in the lightly doped region 104. The lightly doped region 104 contains a first impurity element giving a first conductivity type. The heavily doped region 102, the lightly doped region 103, and the heavily doped region 108 contain a second impurity element giving a second conductivity type that is an opposite conductivity type to the first conductivity type.

In the MOSFET 151, the heavily doped region 108 functions as one of a source region and a drain region. Further, in the MOSFET 151, the heavily doped region 102 functions as the other of the source region and the drain region.

The conductive film 121 functions as one of a source electrode and a drain electrode, while the conductive film 114 functions as the other of the source electrode and the drain electrode.

The MOSFET 161 includes the conductive film 114, the heavily doped region 102, the lightly doped region 103, a lightly doped region 134, the insulating film 109, and a conductive film 131.

The MOSFET 161 includes the gate electrode 106 and the gate insulating film 107 embedded in the lightly doped region 103 and the lightly doped region 134. Further, a heavily doped region 138 is formed in the lightly doped region 134. The heavily doped region 138 contains an impurity element giving the same conductivity type as the impurity element contained in the heavily doped region 108, and the heavily doped region 138 and the heavily doped region 108 have the same impurity concentration.

A channel formation region 140 is formed in a region between the heavily doped region 138 formed in the lightly doped region 134 and the gate electrode 106. In other words, the channel formation region 140 and the lightly doped region 134 contain the same impurity element and have the same concentration of the impurity element.

The concentration of the first impurity element contained in the channel formation region 140, that is, the concentration of the first impurity element contained in the lightly doped region 134 is controlled to keep the MOSFET 161 normally on. On the other hand, the concentration of the first impurity element contained in the channel formation region 110, that is, the concentration of the first impurity element contained in the lightly doped region 104 is controlled to keep the MOSFET 151 normally off.

In other words, the first impurity element contained in the channel formation region 110 and that contained in the channel formation region 140 are at different concentrations. Each concentration decides whether the insulated gate bipolar transistor is normally off or normally on.

Therefore, the normally-off MOSFET and the normally-on MOSFET can be differently formed by only differentiating impurity concentration between the channel formation region 110 and the channel formation region 140.

Note that in the MOSFET 161, the heavily doped region 108 functions as one of a source region and a drain region. Further, in the MOSFET 161, the heavily doped region 102 functions as the other of the source region and the drain region.

Note that in the MOSFET 161, the conductive film 131 functions as one of a source electrode and a drain electrode, while the conductive film 114 functions as the other of the source electrode and the drain electrode.

Embodiment 1 allows the transistor serving as a switching element and the diode serving as a rectifier which are included in a converter circuit to be fabricated using the same material and in the same process.

The photoelectric transducer element 307 or the photoelectric transducer element 317 of this embodiment will be described with reference to FIG. 14. In this embodiment, a solar cell using an amorphous semiconductor layer as a photoelectric transducer layer will be described as an example of the photoelectric transducer element 307.

Figure 14:
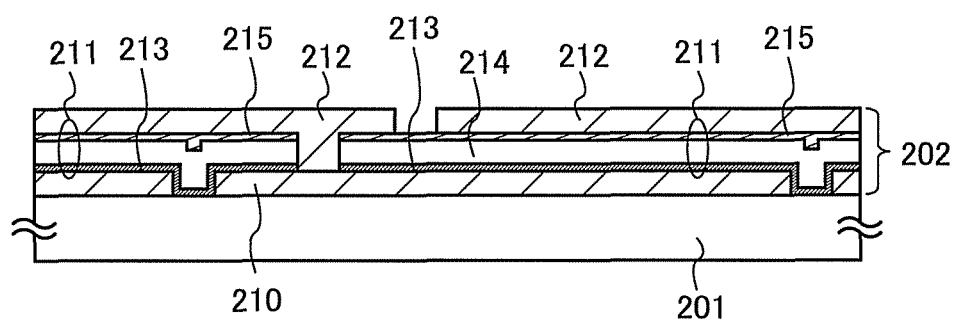
FIG. 14 is a cross-sectional view of a solar cell.

A solar cell shown in FIG. 14 includes a photoelectric transducer layer 211 which is over a light-transmitting substrate 201 and which is an amorphous semiconductor layer including a p-type amorphous semiconductor layer 213, an intrinsic amorphous semiconductor layer 214, and an n-type amorphous semiconductor layer 215. A conductive film 210 is formed on one surface of the photoelectric transducer layer 211. A conductive film 212 is formed on the other surface of the photoelectric transducer layer 211.

Specifically, the p-type amorphous semiconductor layer 213, the intrinsic amorphous semiconductor layer 214, and the n-type amorphous semiconductor layer 215 are layered over the conductive film 210. The conductive film 212 is formed over the n-type amorphous semiconductor layer 215.

The conductive film 210, the photoelectric transducer layer 211, and the conductive film 212 are processed into predetermined shapes. The conductive film 210, the photoelectric transducer layer 211, and the conductive film 212 processed into such predetermined shapes form a cell 202. One cell 202 is connected to another cell in series. When each cell 202 is connected to another cell 202 in series, output voltage can be increased.

The light-transmitting substrate 201 uses a material that transmits sunlight, on the assumption that light enters from the light-transmitting substrate 201 side.

For example, a glass plate of soda-lime glass, white glass, lead glass, tempered glass, ceramic glass, or the like can be used as the light-transmitting substrate 201. Alternatively, a non-alkali glass substrate of aluminosilicate glass, barium borosilicate glass, aluminoborosilicate glass, or the like; a quartz substrate; or a ceramic substrate can be used.

Although a flexible substrate of a synthetic resin such as plastics (a plastic substrate) generally tends to have a lower heat resistance than the above substrates, it can be used as the light-transmitting substrate 201, which transmits light, as long as it can withstand processing temperatures in fabrication steps.

Polyester, polyether sulfone (PES), polyethylene naphthalate (PEN), polycarbonate (PC), a polyamide synthetic fiber, polyether etherketone (PEEK), polysulfone (PSF), polyether imide (PEI), polyarylate (PAR), polybutylene terephthalate (PBT), polyimide, an acrylonitrile butadiene styrene resin, poly vinyl chloride, polypropylene, poly vinyl acetate, an acrylic resin, or the like can be used for the plastic substrate. An example of polyester is polyethylene terephthalate (PET).

Since light enters from the light-transmitting substrate 201 side, a conductive material which transmits sunlight is used for the conductive film 210.

Examples of a preferable light-transmitting conductive material include indium tin oxide (ITO), indium tin oxide containing silicon oxide (ITSO), organoindium, organotin, zinc oxide, indium zinc oxide (MO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, and indium tin oxide containing titanium oxide.

Note that in the case where indium tin oxide is used for the conductive film 210, if the p-type amorphous semiconductor layer 213 formed in a later step is formed over the conductive film 210, hydrogen contained in the p-type amorphous semiconductor layer 213 reduces indium tin oxide contained in the conductive film 210. Thus, the film quality of the conductive film 210 might deteriorate.

In the case where indium tin oxide is used for the conductive film 210, in order to prevent indium tin oxide from being reduced, a film in which a conductive film with a thickness of several tens of nanometers using tin oxide or using a conductive material containing a mixed material of zinc oxide and aluminum nitride is stacked between the conductive film using indium tin oxide and the p-type amorphous semiconductor layer 213 is preferably used as the conductive film 210.

When a surface of the conductive film 210 on the photoelectric transducer layer 211 side is made uneven, light is refracted or irregularly reflected off the conductive film 210. This is preferable in that optical absorptance in the photoelectric transducer layer 211 can be increased, which increases light conversion efficiency.

The photoelectric transducer layer 211 which is a stack of the p-type amorphous semiconductor layer 213 overlaid by the intrinsic amorphous semiconductor layer 214 overlaid by the n-type amorphous semiconductor layer 215 is provided over the conductive film 210.

In Embodiment 1, a p-type amorphous silicon layer is used as the p-type amorphous semiconductor layer 213. The p-type amorphous silicon layer is a silicon layer containing an element giving p-type conductivity (e.g., boron).

In Embodiment 1, an intrinsic amorphous silicon layer is used as the intrinsic amorphous semiconductor layer 214.

In Embodiment 1, an n-type amorphous silicon layer is used as the n-type amorphous semiconductor layer 215. The n-type amorphous silicon layer is a silicon layer containing an element giving n-type conductivity (e.g., phosphorus).

Note that, in Embodiment 1, although the case where the photoelectric transducer layer 211 is a stack of the p-type amorphous semiconductor layer 213 overlaid by the intrinsic amorphous semiconductor layer 214 overlaid by the n-type amorphous semiconductor layer 215 is described as an example, the photoelectric transducer layer 211 may alternatively be a stack of the n-type amorphous semiconductor layer overlaid by the intrinsic amorphous semiconductor layer overlaid by the p-type amorphous semiconductor layer.

Note that such layers are not necessarily amorphous semiconductor layers or single crystal semiconductor layers, and the p-type semiconductor layer is preferably located more on the side where light enters than the n-type semiconductor layer. The lifetime of a hole as a carrier is as short as approximately half the lifetime of an electron as a carrier. When light enters the photoelectric transducer layer having a pin junction, a large amount of electrons and holes are formed in the intrinsic semiconductor layer, the electrons move to the n-type semiconductor layer side, and the holes move to the p-type semiconductor layer side, which produces electromotive force.

When light enters from the p-type semiconductor layer side, electrons and holes are formed in the intrinsic semiconductor layer more on the p-type semiconductor layer side than on the n-type semiconductor layer side. Consequently, a distance that the holes with a short lifetime take to get to the p-type semiconductor layer can be shortened. This produces high electromotive force.

In Embodiment 1, light enters from both the p-type semiconductor layer side and the n-type semiconductor layer side. For this reason, the photoelectric transducer layer may be either a stack of the n-type semiconductor layer overlaid by the intrinsic semiconductor layer overlaid by the p-type semiconductor layer or a stack of the p-type semiconductor layer overlaid by the intrinsic semiconductor layer overlaid by the n-type semiconductor layer. Note that forming the p-type semiconductor layer on the side where light with higher intensity enters produces higher electromotive force.

As described above, the photoelectric transducer device of Embodiment 1 can reduce power consumption. In addition, the photoelectric transducer device of Embodiment 1 can reduce fabrication cost.

Embodiment 2

In Embodiment 2, an example of a circuit configuration of the converter circuit described in Embodiment 1 will be described with reference to FIG. 15.

Figure 15:
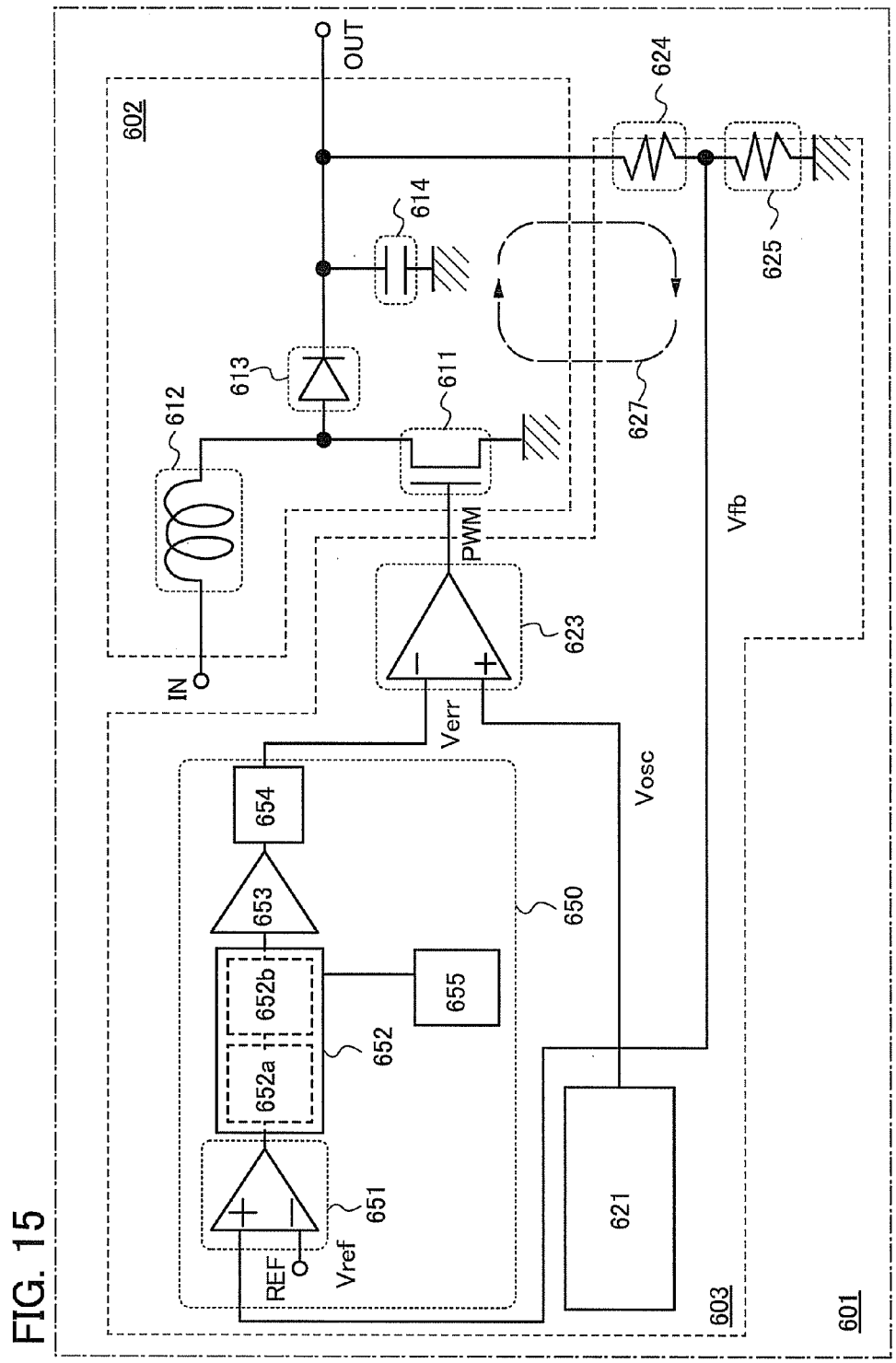
FIG. 15 is a circuit diagram of a converter circuit.

FIG. 15 shows a structure example of a power supply circuit 601. The power supply circuit 601 includes a voltage conversion circuit 602 which is a converter circuit, and a control circuit 603 of the voltage conversion circuit 602. The voltage conversion circuit 602 is the DC-DC converter of Embodiment 1.

The voltage conversion circuit 602 includes a transistor 611, a coil 612, a diode 613, and a capacitor 614. The control circuit 603 includes a triangle-wave generating circuit 621, a digital control circuit 650, a pulse width modulation output driver 623, a resistor 624, and a resistor 625. A dotted arrow 627 represents the loop of a feedback circuit. Feedback voltage $V_{fb}$ that is the output voltage of the resistor 624 is input to the digital control circuit 650.

The use of the diode-connected normally-on insulated gate bipolar transistor of Embodiment 1 as the diode 613 included in the voltage conversion circuit 602 is preferable in that it enables control of voltage drop.

The use of the normally-off insulated gate bipolar transistor of Embodiment 1 as the transistor 611 included in the voltage conversion circuit 602 is preferable in that it allows the insulated gate bipolar transistor to be made normally on or normally off by differentiating impurity concentration in the channel formation region without changing the stacking structure of the insulated gate bipolar transistor.

The digital control circuit 650 includes a comparator 651, a digital arithmetic processing circuit 652, a pulse width modulation output driver 653, and a low pass filter (LPF) 654.

In the digital control circuit 650, the digital arithmetic processing circuit 652 and the pulse width modulation output driver 653 are digital circuits. A digital circuit judges whether a signal passing through a circuit is 1 or 0 (zero) from the level of the signal with respect to the reference. Since the digital circuit judges whether the signal is 1 or 0 (zero), adequate processing is possible even when the characteristic of an element included in the digital circuit fluctuates.

The digital control circuit 650 is preferable in that it suppresses the use of a passive element that occupies a large area (e.g., a capacitor or a resistor), and thus can reduce the area of the circuit.

The comparator 651 compares reference voltage $V_{ref}$ input from an inversion input terminal REF with input voltage $V_{in}$ input from a non-inversion input terminal IN and outputs an H-level (high-level) digital signal or an L-level (low-level) signal, i.e., a digital signal that is 1 or 0 (zero).

The digital arithmetic processing circuit 652 includes a digital averaging integrator 652a and a digital pulse width modulator 652b. An externally provided clock divider 655 is connected to the digital arithmetic processing circuit 652, and a clock signal from the clock divider 655 is input to the digital arithmetic processing circuit 652.

The digital arithmetic processing circuit 652 performs averaging treatment, integration treatment, and digital pulse width modulation treatment on a digital signal output from the comparator 651. In the digital arithmetic processing circuit 652, the digital averaging integrator 652a performs averaging treatment and integration treatment, and the digital pulse width modulator 652b performs digital pulse width modulation treatment.

The digital arithmetic processing circuit 652 first holds N-bit digital signals (including a high level (H) signal and a low level (L) signal) output from the comparator 651, then compares the number of H signals with that of L signals, and then outputs an H signal when the number of H signals is larger than that of L signals, and an L signal in the contrary case. Thus, the digital signal is averaged.

In accordance with the averaged digital signal, integration is performed by addition of "−1" when the level of the signal is H, and integration is performed by addition of "+1" when the level of the signal is L. Thus, the averaged digital signal is integrated.

The position of a phase in pulse width modulation is set in accordance with the integrated digital signal. Thus, digital pulse width modulation treatment is performed. A pulse width modulation output signal on which the digital pulse width modulation treatment is performed is input to the pulse width modulation output driver 653.

The triangle-wave generating circuit 621 generates a triangle wave $V_{osc}$ which is necessary for a pulse width modulation generation signal.

An output signal $V_{err}$ of the digital control circuit 650 is input to the inversion input terminal of the pulse width modulation output driver 623, and the triangle wave $V_{osc}$ generated by the triangle-wave generating circuit 621 is input to the non-inversion input terminal.

The pulse width modulation output driver 623 compares the output signal $V_{err}$ of the digital control circuit 650 and the triangle wave $V_{osc}$ with each other and outputs an H-level (high-level) signal to the transistor 611 as the pulse width modulation signal when the signal level of the triangle wave $V_{osc}$ is higher than that of the output signal $V_{err}$ of the digital control circuit 650. In contrast, when the signal level of the triangle wave $V_{osc}$ is lower than that of the output signal $V_{err}$ of the digital control circuit 650, the pulse width modulation output driver 623 outputs an L-level (low-level) signal to the transistor 611 as the pulse width modulation signal.

As described above, the photoelectric transducer device of Embodiment 1 can reduce power consumption. In addition, the photoelectric transducer device of Embodiment 1 can reduce fabrication cost.

Embodiment 3

In Embodiment 3, a photovoltaic module is obtained by using the photoelectric transducer device of Embodiment 1 or 2. The case where the obtained photovoltaic module is mounted on an electric propulsion motor car will be described as an example.

FIGS. 16A and 16B, FIGS. 17A and 17B, and FIG. 18 show an example of the photovoltaic module of Embodiment 3. The photovoltaic module of Embodiment 3 is fabricated using the photoelectric transducer device of Embodiment 1 or 2.

Figure 18:
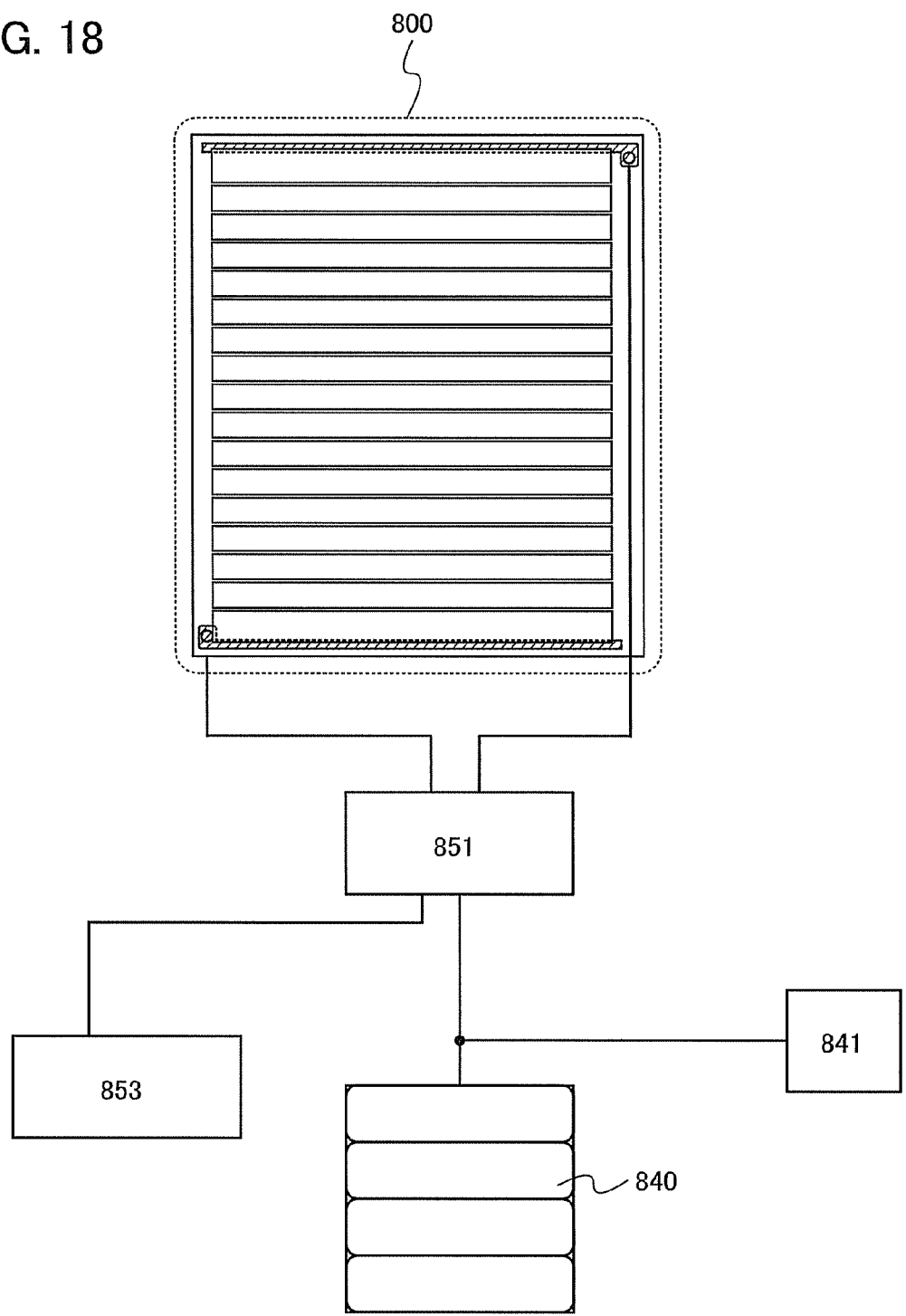
FIG. 18 is a diagram showing a photovoltaic system using the photovoltaic module.

FIG. 18 shows an example of a photovoltaic system using a photovoltaic module 800.

A voltage conversion circuit 851 including a DC-DC converter or the like is connected to the photovoltaic module 800. The output voltage of the photovoltaic module 800 is raised or lowered by the voltage conversion circuit 851.

A control circuit 853 is connected to the voltage conversion circuit 851. The control circuit 853 performs maximum power point tracking (MPPT) on the voltage conversion circuit 851 so as to obtain the maximum power of the photovoltaic module 800.

In addition, the control circuit 853 controls output voltage from the voltage conversion circuit 851 and stores electricity in a storage battery 840. Further, in the case where electricity is sufficiently stored in the storage battery 840, the control circuit 853 controls electric power supplied from the photovoltaic module 800 so that the electric power is directly output to an external circuit 841.

The photovoltaic module 800 is fabricated using the photoelectric transducer device of Embodiment 1 or 2. In Embodiment 3, the solar cell using an amorphous semiconductor layer as the photoelectric transducer layer 211 described in Embodiment 1 is used as an example of the photovoltaic module 800. Note that the photovoltaic module 811 is not necessarily the solar cell, and may be the different solar cell described in Embodiment 1.

When an electric double layer capacitor is used as the storage battery 840, the storage battery 840 does not need chemical reaction in charging; thus, electricity can be stored in the storage battery 840 rapidly. Further, lifetime can be increased about eight times and charging and discharging efficiency can be increased about 1.5 times compared with those of a lead storage battery or the like which uses chemical reaction. The photovoltaic system described in Embodiment 3 can be used in a variety of external circuits 841 which use electric power, such as lighting or electronic devices.

Figure 16A:
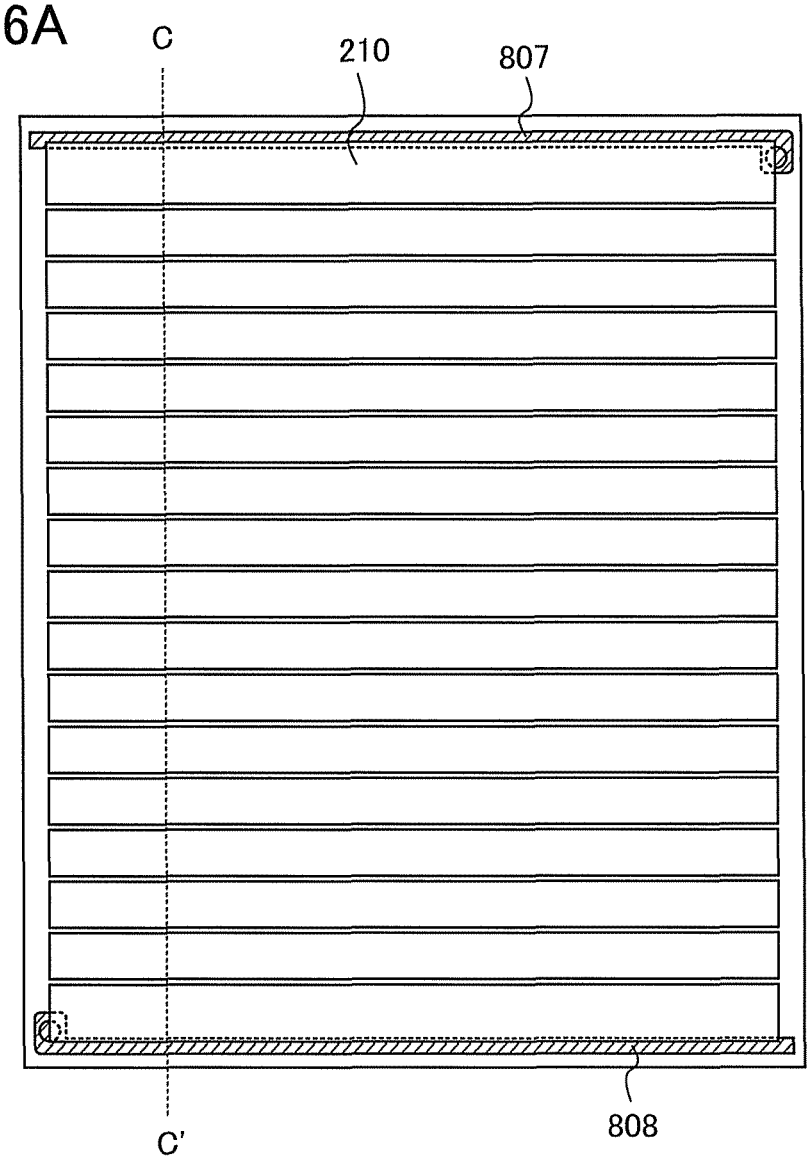
FIGS. 16A and 16B are a top view and a cross-sectional view of a photovoltaic module.
Figure 16B:
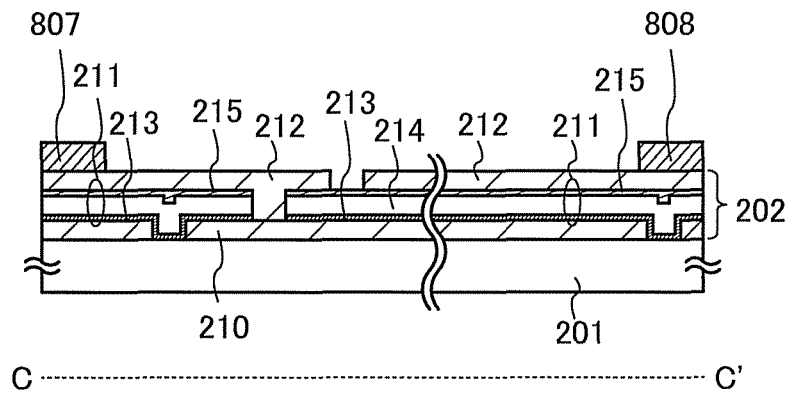

FIGS. 16A and 16B show a structure example of the photovoltaic module 800.

The photovoltaic module 800 is the solar cell using an amorphous semiconductor layer as the photoelectric transducer layer 211 described in Embodiment 1. Note that components in FIGS. 16A and 16B use the same reference numerals as the components in FIG. 14. FIG. 16B is a cross-sectional view along section C-C' in FIG. 16A.

An auxiliary electrode 807 and an auxiliary electrode 808 are formed in contact with the conductive film 212 provided over the photoelectric transducer layer 211. Each of the auxiliary electrode 807 and the auxiliary electrode 808 is electrically connected to the conductive film 212 in a cell at the farthest end.

Figure 17A:
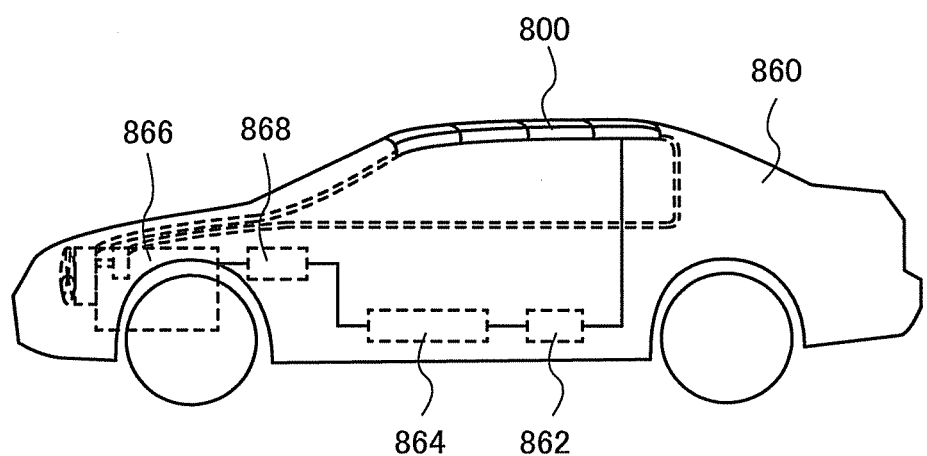
FIGS. 17A and 17B are diagrams showing an electric propulsion motor car including the photovoltaic module.
Figure 17B:
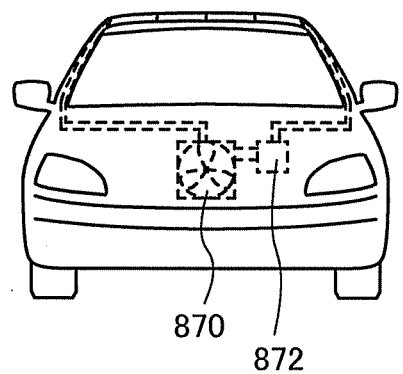

FIGS. 17A and 17B show an example of an electric propulsion motor car 860 in which the photovoltaic module 800 shown in FIGS. 16A and 16B is mounted on its roof portion. The photovoltaic module 800 is connected to a battery or a capacitor 864 through a converter 862. In other words, electricity is stored in the battery or the capacitor 864 with the use of electric power supplied from the photovoltaic module 800. Charging and discharging may be selected in accordance with the operation condition of an engine 866 which is monitored by a monitor 868.

The photoelectric conversion efficiency of the photovoltaic module 800 tends to be decreased by heat. In order to suppress such a decrease in photoelectric conversion efficiency, liquid for cooling or the like may be circulated in the photovoltaic module 800. For example, cooling water in a radiator 870 may be circulated by a circulation pump 872. Needless to say, this embodiment is not limited to the structure in which the liquid for cooling is shared by the photovoltaic module 800 and the radiator 870. In the case where the decrease in photoelectric conversion efficiency is not serious, the liquid does not need to be circulated.

The photoelectric transducer device of Embodiment 3 is preferable in that it reduces a voltage drop, needs a low voltage to compensate a voltage drop, reduces the power consumption of a converter circuit, and reduces the power consumption of a photoelectric transducer device.

Further, the photoelectric transducer device of Embodiment 3 is preferable in that it reduces the fabrication cost of the converter circuit and the fabrication cost of the photoelectric transducer device.

This application is based on Japanese Patent Application serial no. 2010-120181 filed with Japan Patent Office on May 26, 2010, the entire contents of which are hereby incorporated by reference.

What is claimed is:

1. A photoelectric transducer device comprising:
   a photoelectric transducer element; and
   a converter circuit stepping up or stepping down an output of the photoelectric transducer element, the converter circuit including a switching element and a rectifier,
   wherein the switching element is a first insulated gate bipolar transistor that is normally off, and
   wherein the rectifier is a second insulated gate bipolar transistor that is diode-connected and normally on.

2. The photoelectric transducer device according to claim 1, wherein the photoelectric transducer element is a solar cell.

3. The photoelectric transducer device according to claim 1, wherein the converter circuit is a DC-DC converter.

4. The photoelectric transducer device according to claim 1, wherein the converter circuit is a DC-DC converter including a coil and a capacitor.

5. A photoelectric transducer device comprising:
   a photoelectric transducer element; and
   a converter circuit stepping up or stepping down an output of the photoelectric transducer element, the converter circuit including a switching element and a rectifier,
   wherein the switching element is a first insulated gate bipolar transistor that is normally off,
   wherein the rectifier is a second insulated gate bipolar transistor that is diode-connected and normally on,
   wherein the first insulated gate bipolar transistor includes a first emitter region, a first channel formation region, and a first collector region, and
   wherein the second insulated gate bipolar transistor includes a second emitter region, a second channel formation region having impurity concentration that is different from impurity concentration in the first channel formation region, and a second collector region.

6. The photoelectric transducer device according to claim 5, wherein the photoelectric transducer element is a solar cell.

7. The photoelectric transducer device according to claim 5, wherein the converter circuit is a DC-DC converter.

8. The photoelectric transducer device according to claim 5, wherein the converter circuit is a DC-DC converter including a coil and a capacitor.

9. A photoelectric transducer device comprising:
a photoelectric transducer element; and
a converter circuit stepping up or stepping down an output of the photoelectric transducer element, the converter circuit including a switching element and a rectifier,
wherein the switching element is a first field-effect transistor that is normally off, and
wherein the rectifier is a second field-effect transistor that is diode-connected and normally on.

10. The photoelectric transducer device according to claim 9, wherein the photoelectric transducer element is a solar cell.

11. The photoelectric transducer device according to claim 9, wherein the converter circuit is a DC-DC converter.

12. The photoelectric transducer device according to claim 9, wherein the converter circuit is a DC-DC converter including a coil and a capacitor.

13. A photoelectric transducer device comprising:
a photoelectric transducer element; and
a converter circuit stepping up or stepping down an output of the photoelectric transducer element, the converter circuit including a switching element and a rectifier,
wherein the switching element is a first field-effect transistor that is normally off,
wherein the rectifier is a second field-effect transistor that is diode-connected and normally on,
wherein the first field-effect transistor includes a first source region, a first drain region, and a first channel formation region, and
wherein the second field-effect transistor includes a second source region, a second drain region, and a second channel formation region having impurity concentration that is different from impurity concentration in the first channel formation region.

14. The photoelectric transducer device according to claim 13, wherein the photoelectric transducer element is a solar cell.

15. The photoelectric transducer device according to claim 13, wherein the converter circuit is a DC-DC converter.

16. The photoelectric transducer device according to claim 13, wherein the converter circuit is a DC-DC converter including a coil and a capacitor.

* * * * *